US012193228B2

(12) United States Patent
Nagahata et al.

(10) Patent No.: US 12,193,228 B2
(45) Date of Patent: Jan. 7, 2025

(54) THREE-DIMENSIONAL NAND MEMORY DEVICE WITH REDUCED REVERSE DIPOLE EFFECT AND METHOD FOR FORMING THE SAME

(71) Applicant: SANDISK TECHNOLOGIES LLC, Addison, TX (US)

(72) Inventors: Noriyuki Nagahata, Yokkaichi (JP); Takashi Yuda, Yokkaichi (JP); Ryousuke Itou, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 338 days.

(21) Appl. No.: 17/064,834

(22) Filed: Oct. 7, 2020

(65) Prior Publication Data
US 2022/0109003 A1    Apr. 7, 2022

(51) Int. Cl.
*H10B 43/27*    (2023.01)
(52) U.S. Cl.
CPC ..................................... *H10B 43/27* (2023.02)
(58) Field of Classification Search
CPC ........... H01L 23/5226; H01L 29/40117; H01L 21/76877; H01L 29/7926; H01L 29/40114
See application file for complete search history.

(56) References Cited

U.S. PATENT DOCUMENTS

| 5,915,167 | A | 6/1999 | Leedy |
| 9,230,974 | B1 | 1/2016 | Pachamuthu et al. |
| 9,305,937 | B1 | 4/2016 | Tsutsumi et al. |
| 9,478,558 | B2 | 10/2016 | Koka et al. |
| 9,613,977 | B2 | 4/2017 | Sharangpani et al. |
| 9,659,955 | B1 | 5/2017 | Sharangpani et al. |
| 9,659,986 | B2 | 5/2017 | Pachamuthu et al. |
| 9,875,929 | B1 | 1/2018 | Shukla et al. |
| 9,991,277 | B1 | 6/2018 | Tsutsumi et al. |
| 10,283,513 | B1 | 5/2019 | Zhou et al. |
| 10,438,964 | B2 | 10/2019 | Makala et al. |
| 10,516,025 | B1 | 12/2019 | Nishikawa et al. |
| 10,529,620 | B2 | 1/2020 | Sharangpani et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Tony Tran
(74) *Attorney, Agent, or Firm* — THE MARBURY LAW GROUP PLLC

(57) ABSTRACT

A memory device includes an alternating stack of insulating layers and electrically conductive layers located over a substrate, a memory opening vertically extending through the alternating stack, and a memory opening fill structure located in the memory opening. The memory opening fill structure includes a memory film and a vertical semiconductor channel. The memory film includes a tunneling dielectric layer, a charge storage layer that laterally surrounds the tunneling dielectric layer, a dielectric metal oxide blocking dielectric layer that laterally surrounds the charge storage layer and contacts the vertical semiconductor channel, and a silicon oxide blocking dielectric layer that laterally surrounds the dielectric metal oxide blocking dielectric layer and contacts the vertical semiconductor channel.

19 Claims, 25 Drawing Sheets

(56) References Cited

U.S. PATENT DOCUMENTS

| | | | |
|---|---|---|---|
| 10,720,444 B2 | 7/2020 | Nishikawa et al. | |
| 2016/0111439 A1 | 4/2016 | Tsutsumi et al. | |
| 2016/0211272 A1 | 7/2016 | Koka et al. | |
| 2016/0379989 A1* | 12/2016 | Sharangpani | H01L 21/31155 438/269 |
| 2017/0125436 A1 | 5/2017 | Sharangpani et al. | |
| 2018/0090373 A1 | 3/2018 | Sharangpani et al. | |
| 2018/0151588 A1 | 5/2018 | Tsutsumi et al. | |
| 2018/0374866 A1 | 12/2018 | Makala et al. | |
| 2019/0139973 A1 | 5/2019 | Zhou et al. | |
| 2019/0267391 A1* | 8/2019 | Imai | H10B 43/40 |
| 2019/0386108 A1 | 12/2019 | Nishikawa et al. | |
| 2020/0020715 A1 | 1/2020 | Nakamura et al. | |
| 2020/0058672 A1 | 2/2020 | Nishikawa et al. | |
| 2020/0328227 A1* | 10/2020 | Kang | H10B 43/27 |

OTHER PUBLICATIONS

Kita, K. et al., "Origin of electric dipoles formed at high-k/SiO$_2$ interface," (Abstract) Appl. Phys. Lett. 94, 132902 (2009); https://doi.org/10.1063/1.3110968.

U.S. Appl. No. 16/227,374, filed Dec. 20, 2018, SanDisk Technologies LLC.
U.S. Appl. No. 16/251,863, filed Jan. 18, 2019, SanDisk Technologies LLC.
U.S. Appl. No. 16/272,468, filed Feb. 11, 2019, SanDisk Technologies LLC.
U.S. Appl. No. 16/295,206, filed Mar. 7, 2019, SanDisk Technologies LLC.
U.S. Appl. No. 16/582,262, filed Sep. 25, 2019, SanDisk Technologies LLC.
U.S. Appl. No. 16/583,906, filed Sep. 26, 2019, SanDisk Technologies LLC.
U.S. Appl. No. 16/695,775, filed Nov. 26, 2019, SanDisk Technologies LLC.
U.S. Appl. No. 16/801,456, filed Feb. 26, 2020, SanDisk Technologies LLC.
U.S. Appl. No. 16/859,164, filed Apr. 27, 2020, SanDisk Technologies LLC.
U.S. Appl. No. 16/859,196, filed Apr. 27, 2020, SanDisk Technologies LLC.
U.S. Appl. No. 16/877,328, filed May 18, 2020, SanDisk Technologies LLC.

* cited by examiner

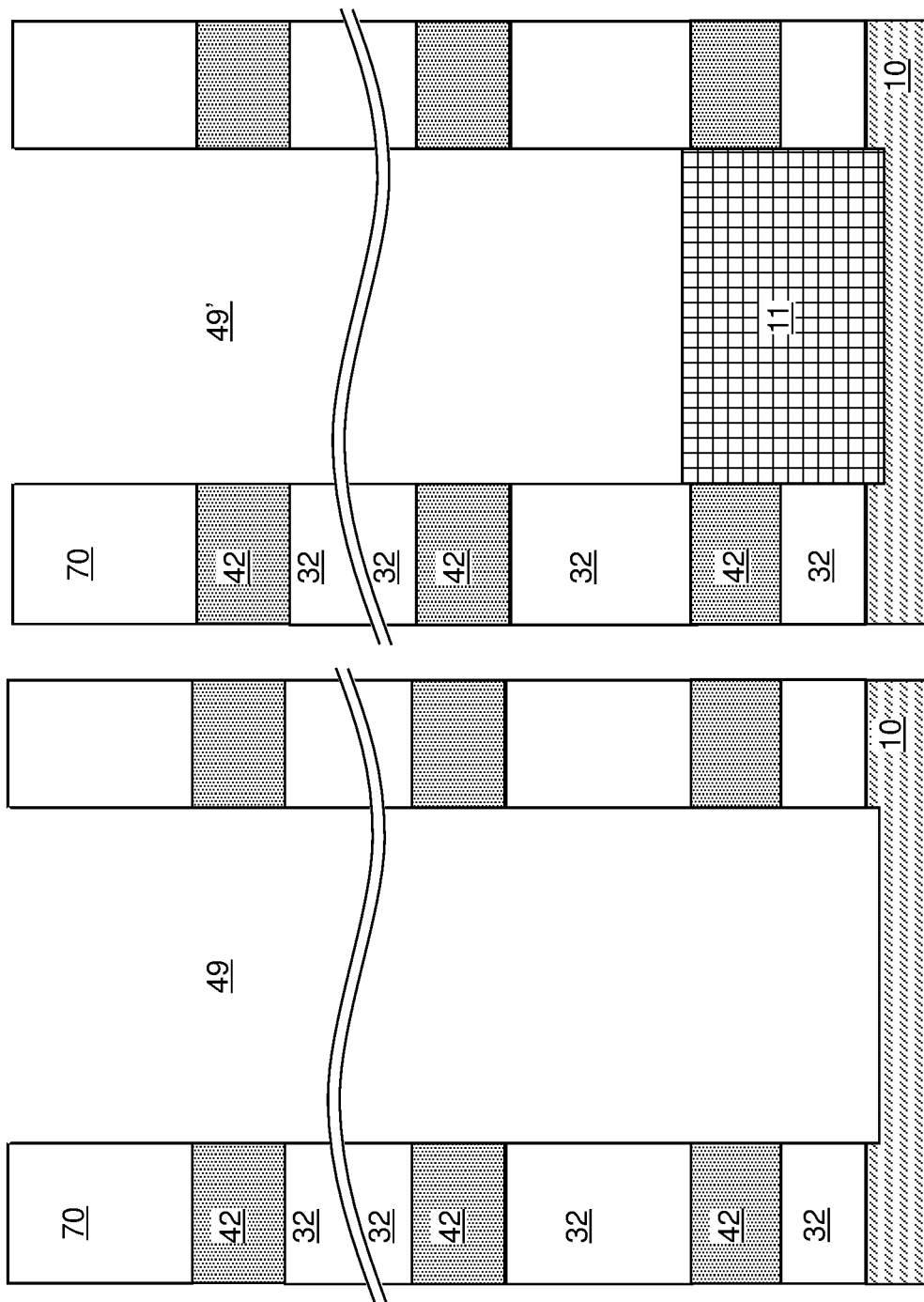

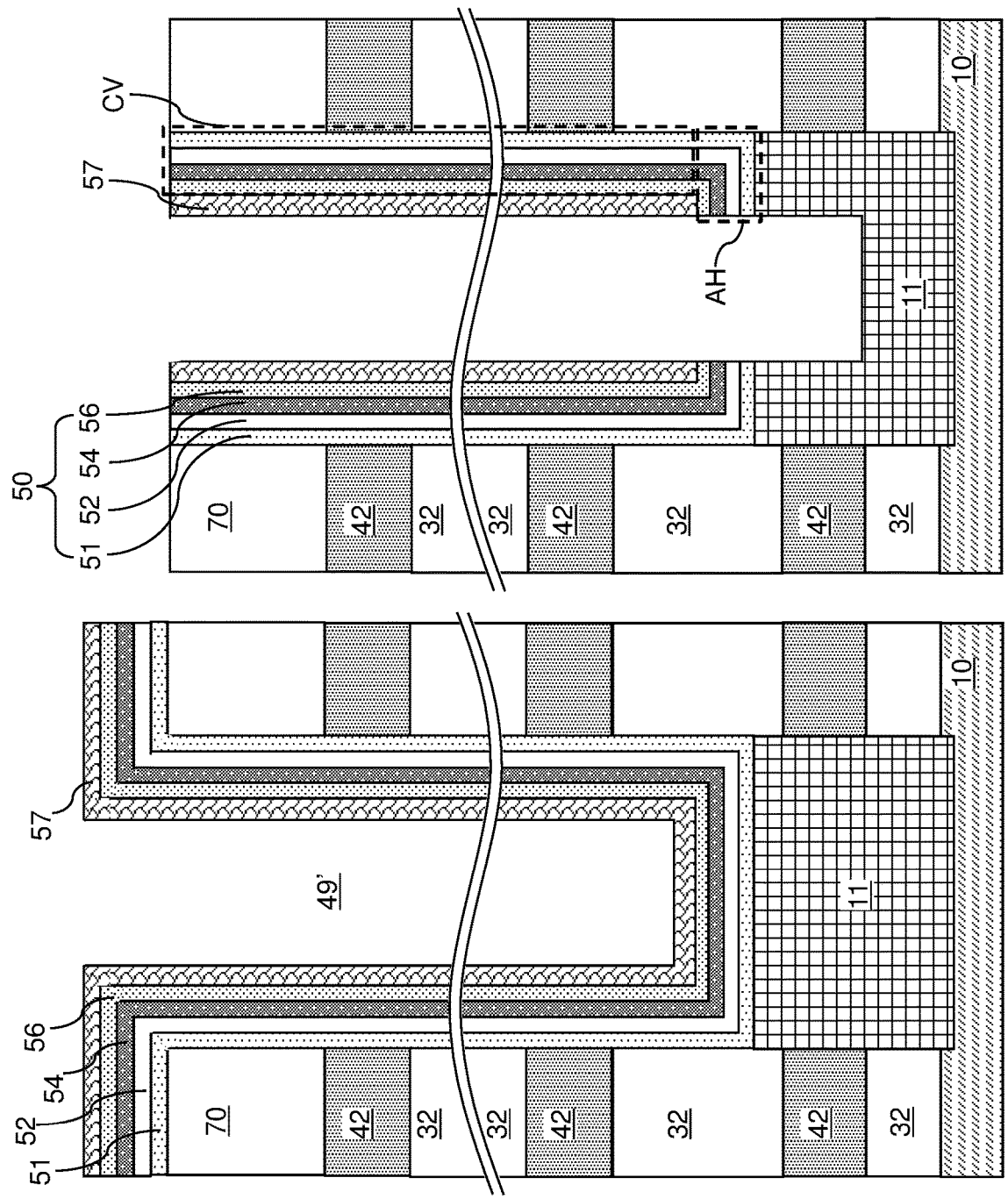

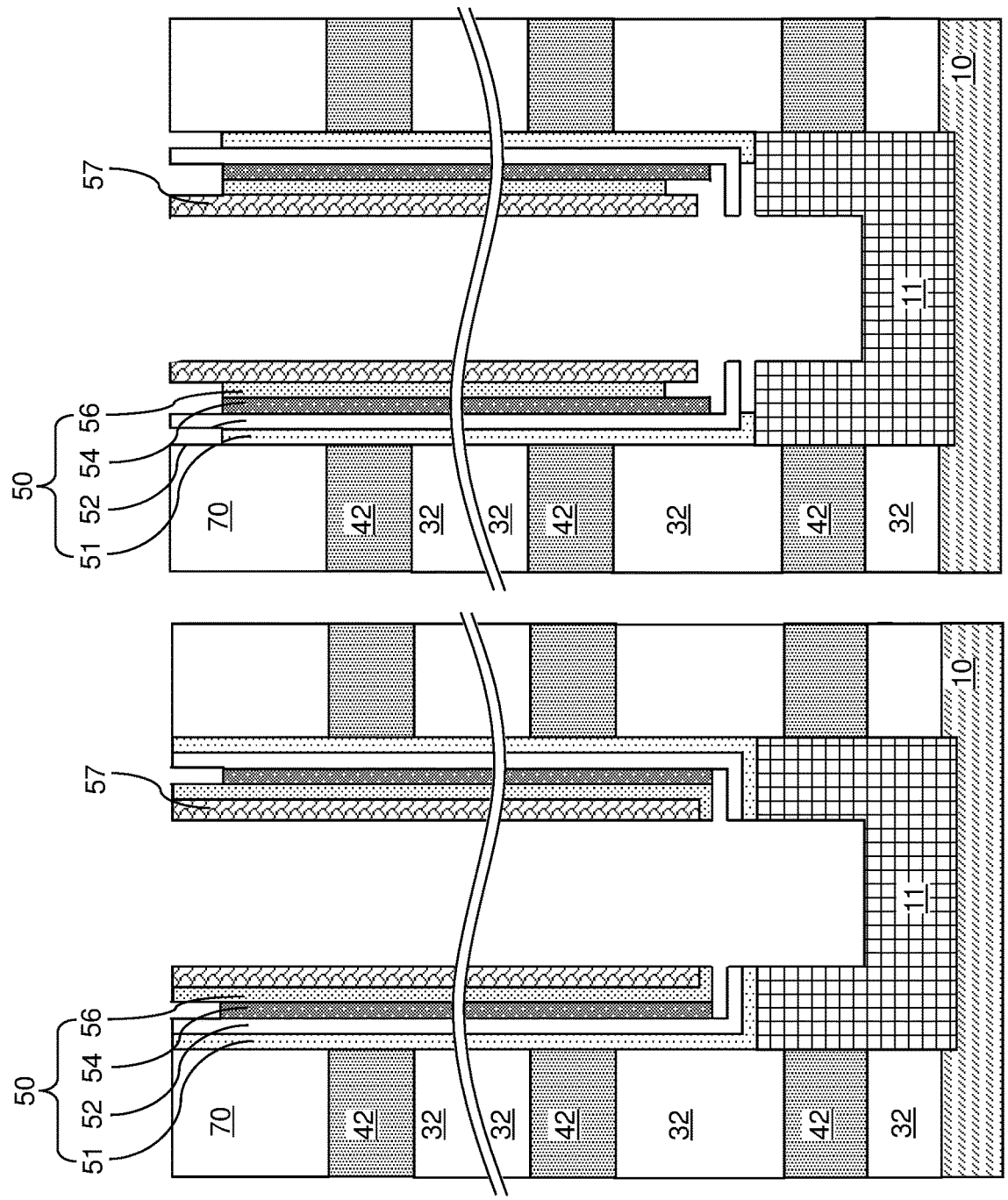

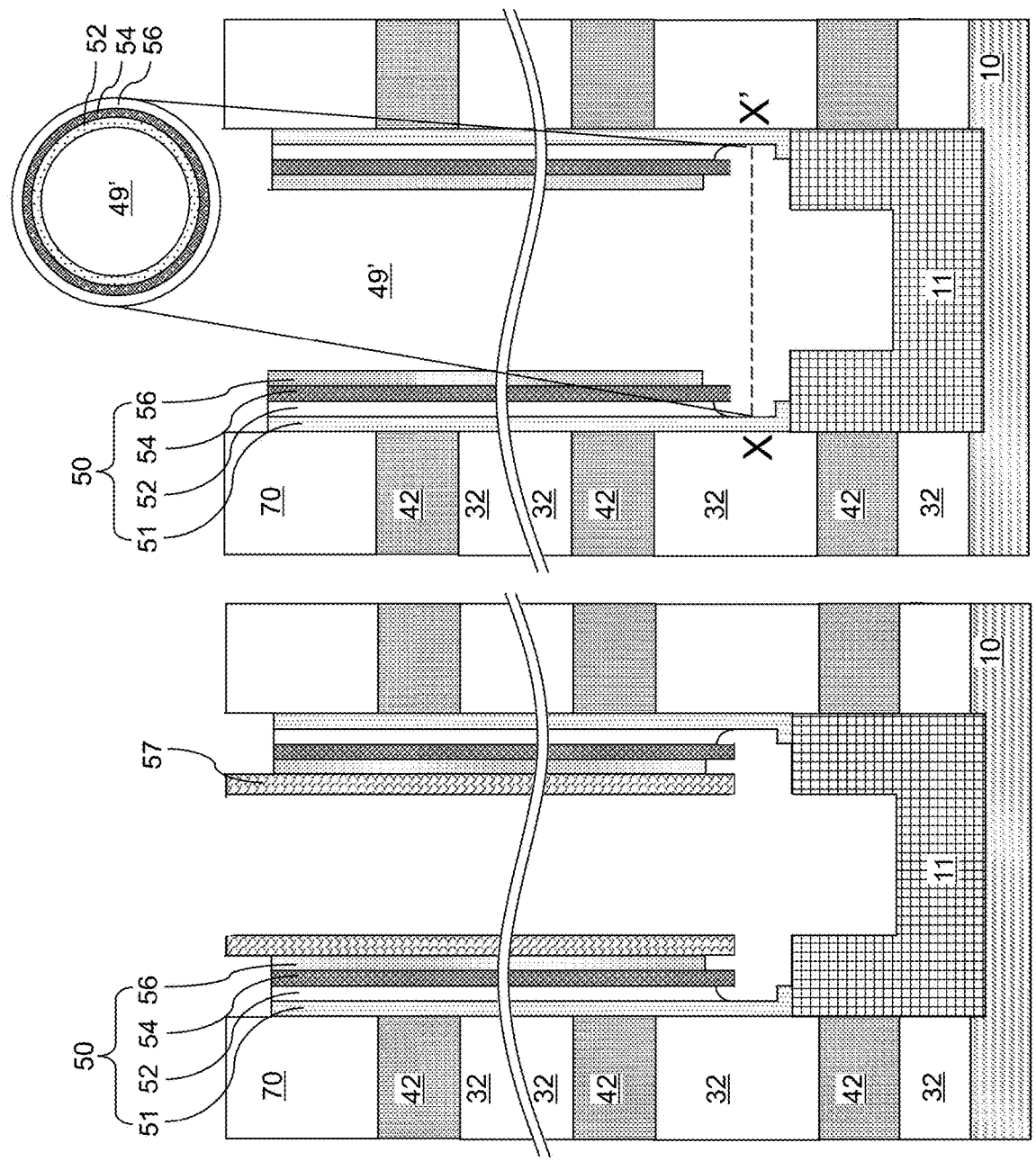

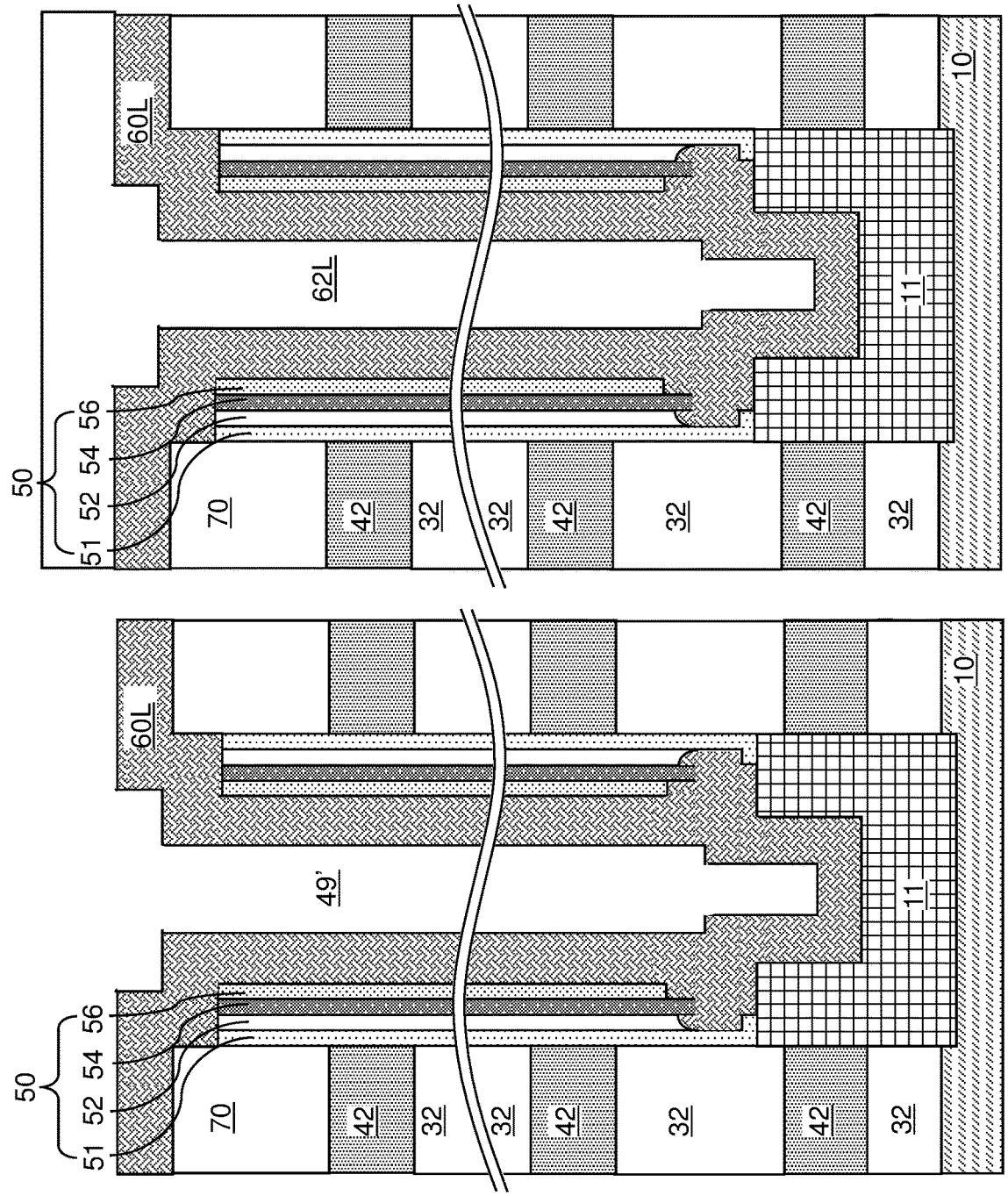

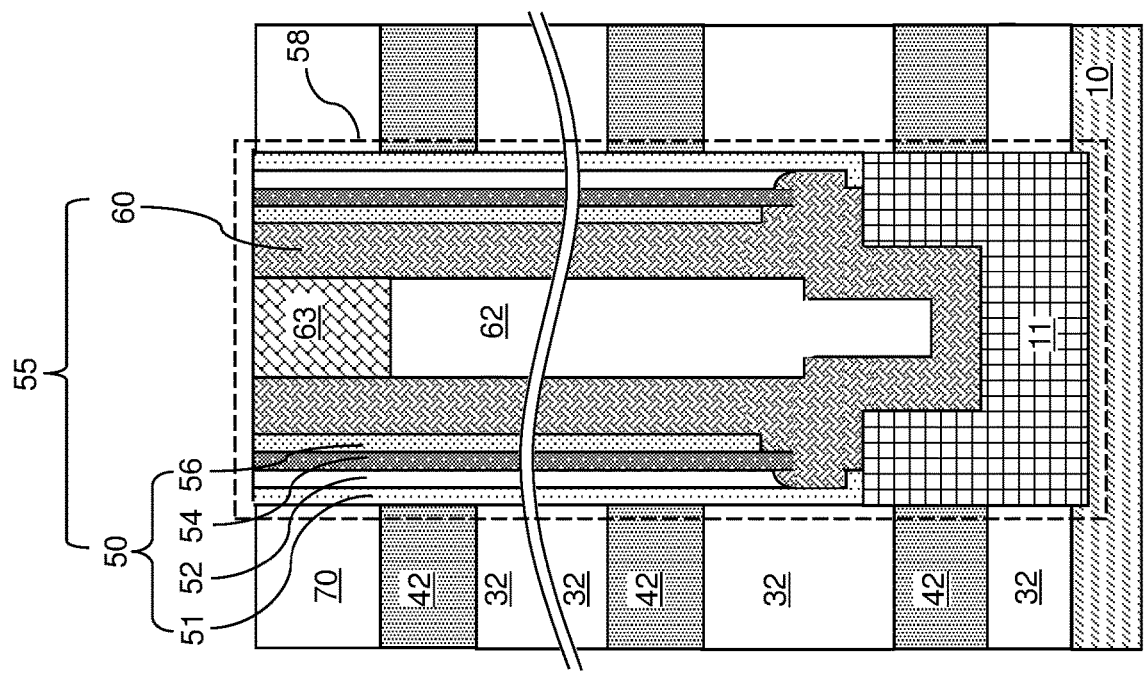
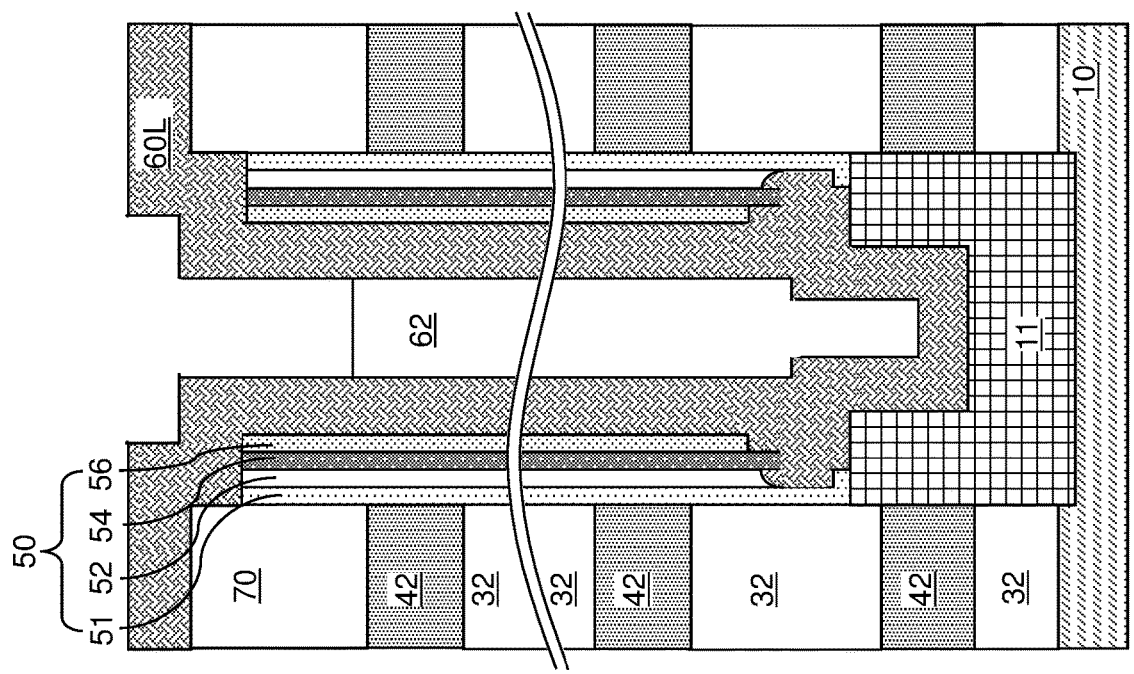
FIG. 5L
FIG. 5K

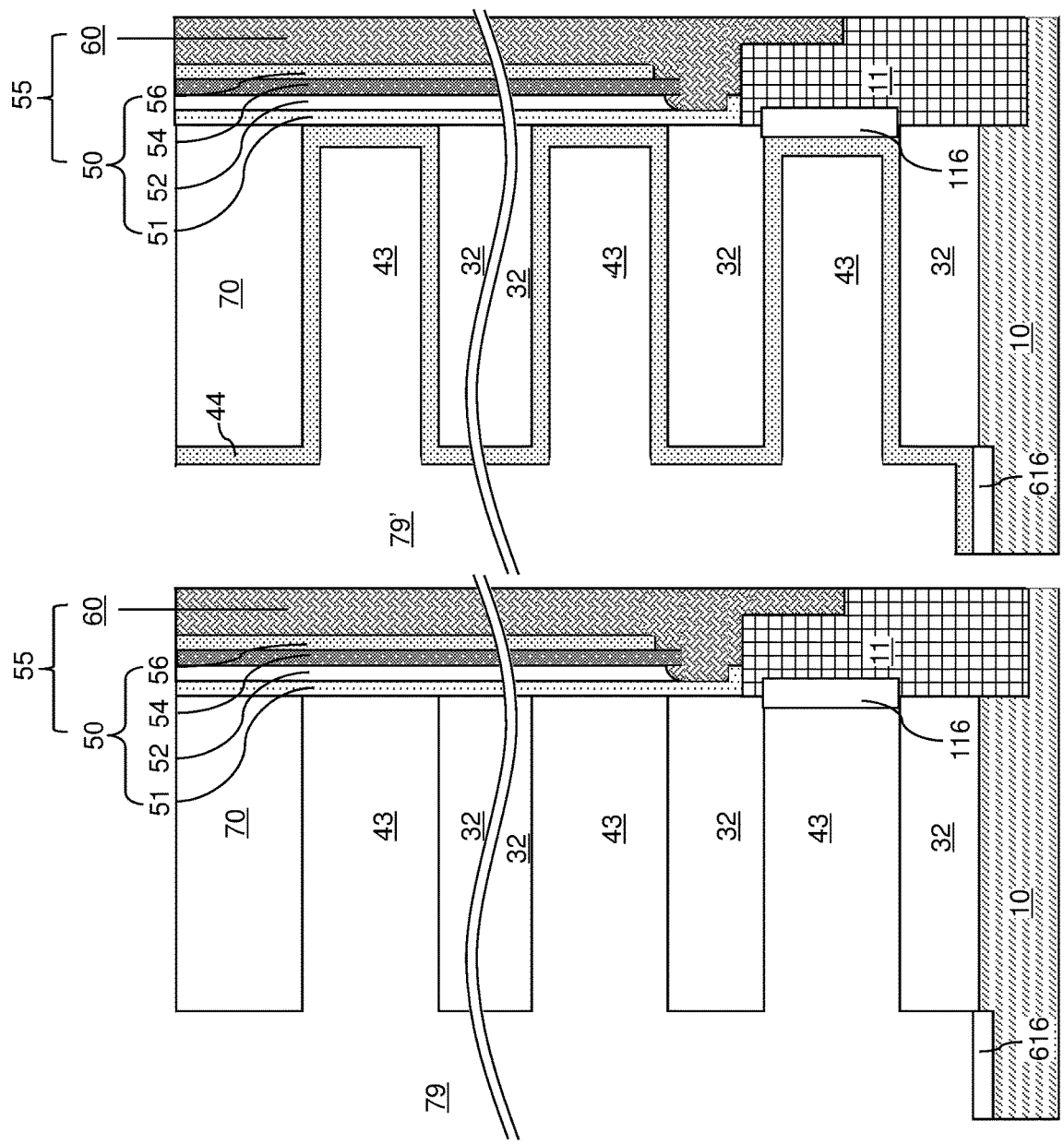

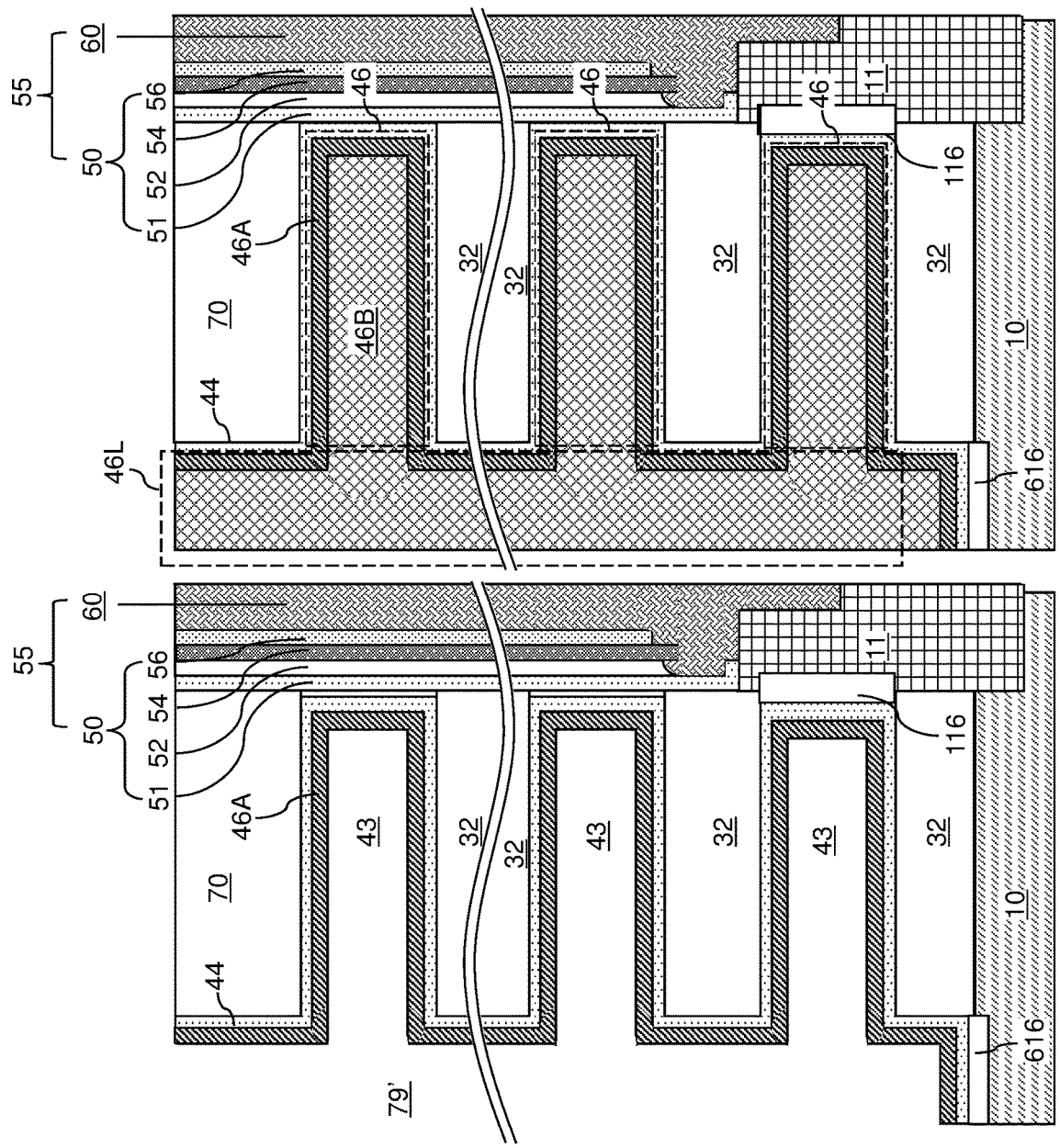

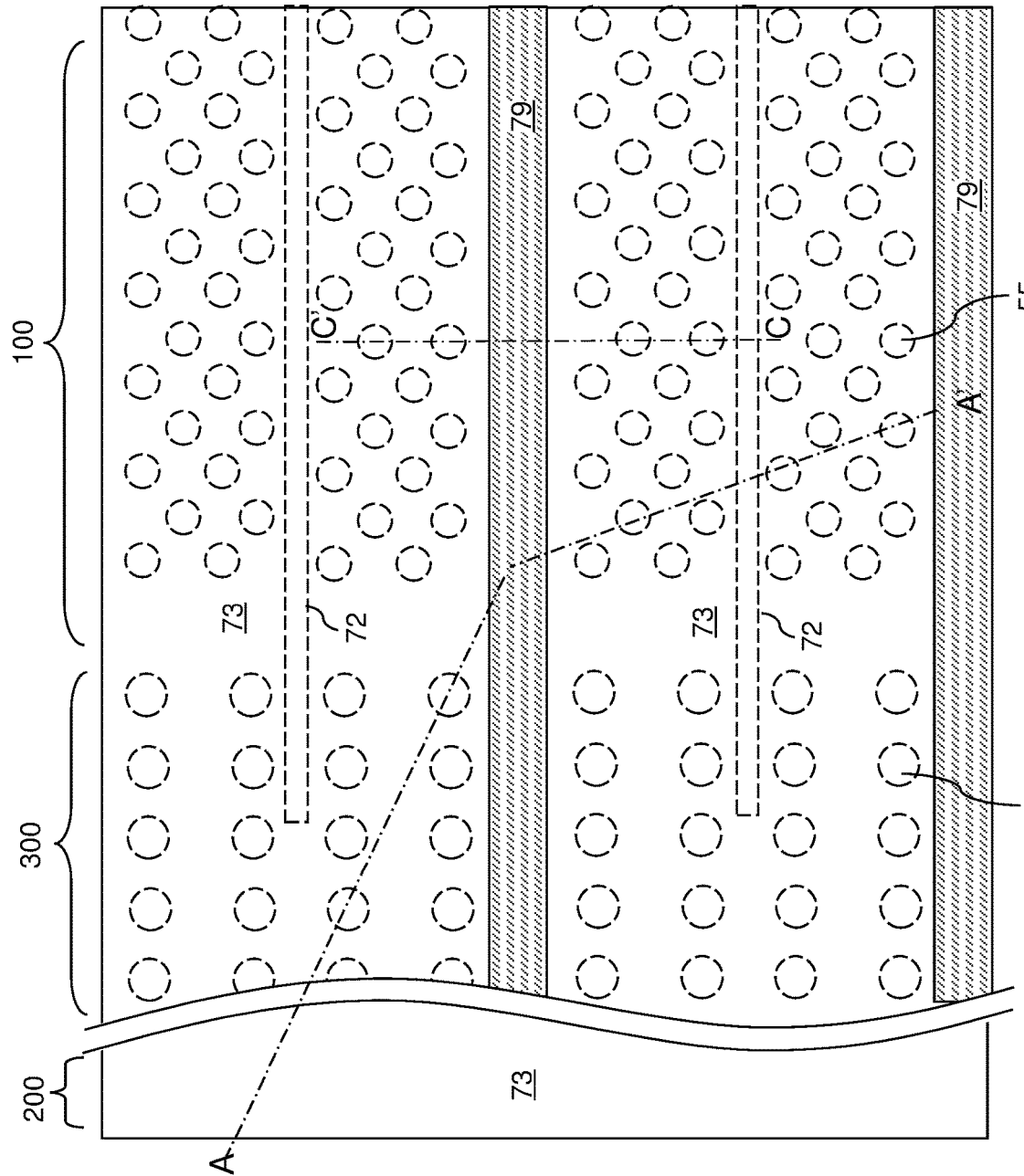

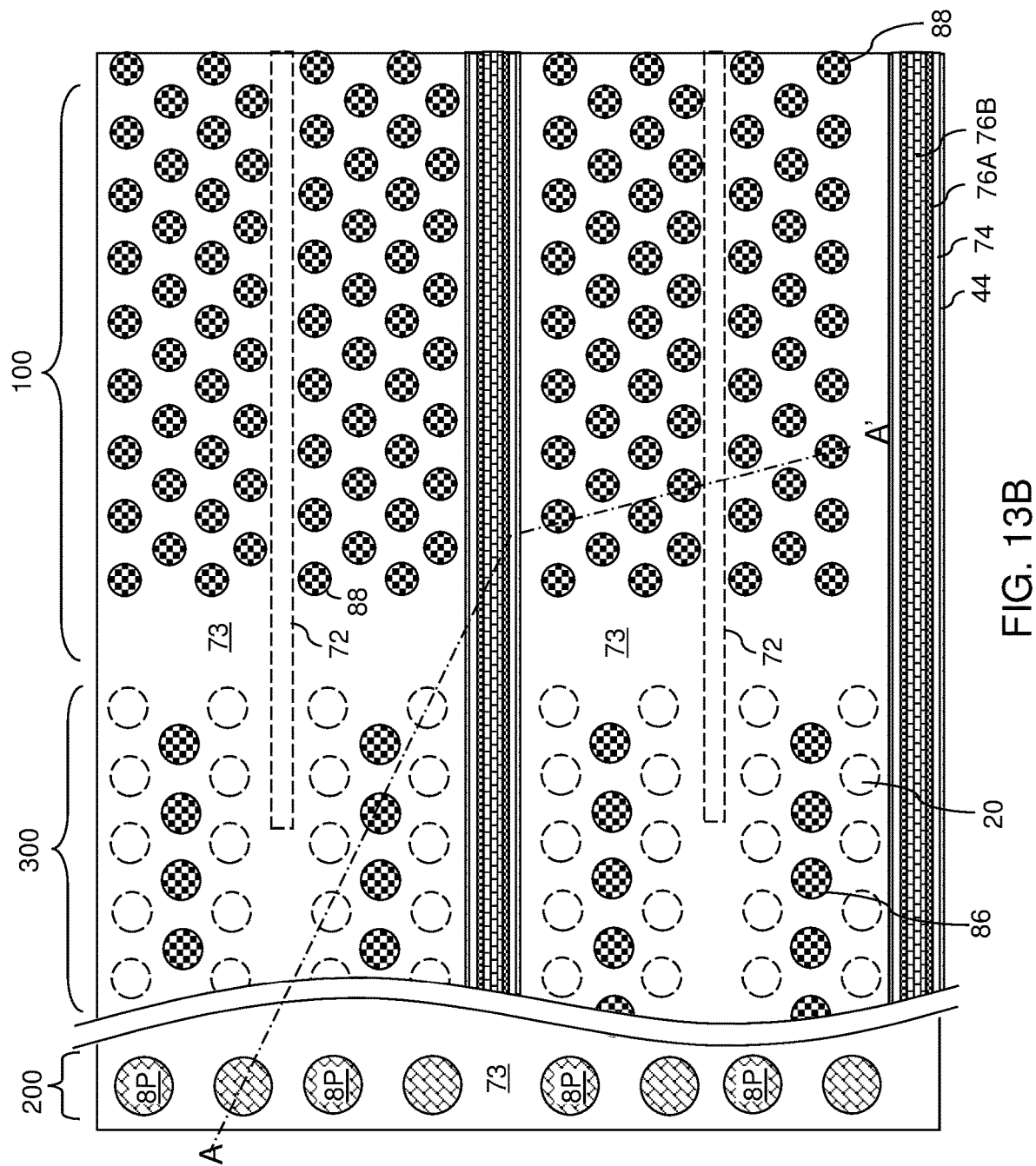

THREE-DIMENSIONAL NAND MEMORY DEVICE WITH REDUCED REVERSE DIPOLE EFFECT AND METHOD FOR FORMING THE SAME

FIELD

The present disclosure relates generally to the field of semiconductor devices, and particular to a three-dimensional NAND memory device with reduced reverse dipole effects and method of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate; a memory opening vertically extending through the alternating stack; and a memory opening fill structure located in the memory opening, wherein: the memory opening fill structure comprises a memory film and a vertical semiconductor channel; and the memory film comprises a tunneling dielectric layer, a charge storage layer that laterally surrounds the tunneling dielectric layer, a dielectric metal oxide blocking dielectric layer that laterally surrounds the charge storage layer and contacts the vertical semiconductor channel, and a silicon oxide blocking dielectric layer that laterally surrounds the dielectric metal oxide blocking dielectric layer and contacts the vertical semiconductor channel.

According to another aspect of the present disclosure, a method of forming a memory device is provided, which comprises: forming an alternating stack of insulating layers and sacrificial material layers over a substrate; forming a memory opening through the alternating stack; forming a layer stack by sequentially depositing a silicon oxide blocking dielectric layer, a dielectric metal oxide blocking dielectric layer, a charge storage layer, a tunneling dielectric layer, and a sacrificial cover layer; anisotropically etching the layer stack, wherein a remaining portion of the dielectric metal oxide blocking dielectric layer comprises am annular horizontal portion having an annular top surface and an annular bottom surface and a cylindrical vertical portion adjoined to an outer edge of the annular horizontal portion; removing the annular portion of the dielectric metal oxide blocking dielectric layer by performing an isotropic recess etch process that isotropically recesses the dielectric metal oxide blocking dielectric layer; removing the sacrificial cover layer; and forming a vertical semiconductor channel on remaining portions of the silicon oxide blocking dielectric layer, the dielectric metal oxide blocking dielectric layer, and the charge storage layer, and the tunneling dielectric layer.

BRIEF DESCRIPTION OF THE DRAWINGS

FIGS. 5A-5L are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 11B is a top-down view of the exemplary structure of FIG. 11A. The vertical plane A-A' is the plane of the cross-section for FIG. 11A.

FIG. 13B is a top-down view of the exemplary structure of FIG. 13A. The vertical plane A-A' is the plane of the schematic vertical cross-sectional view of FIG. 13A.

DETAILED DESCRIPTION

Figure 1:
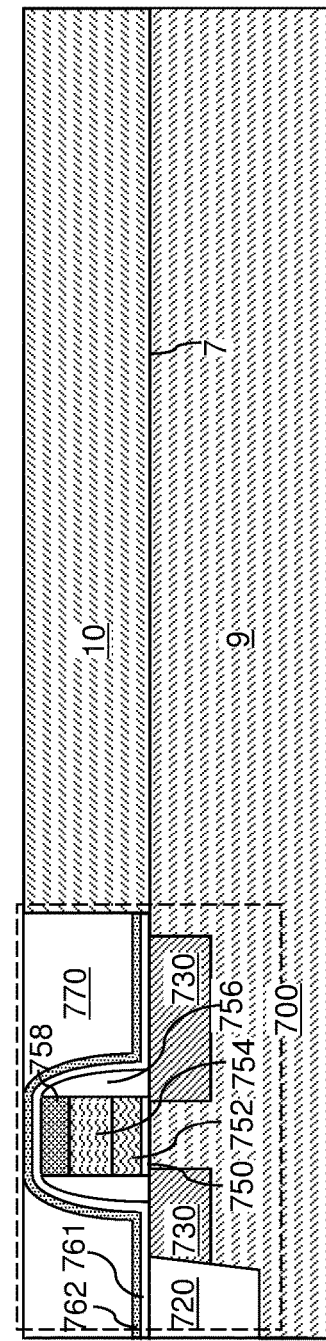
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to a three-dimensional NAND memory device having reduced reverse dipole effects and method of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
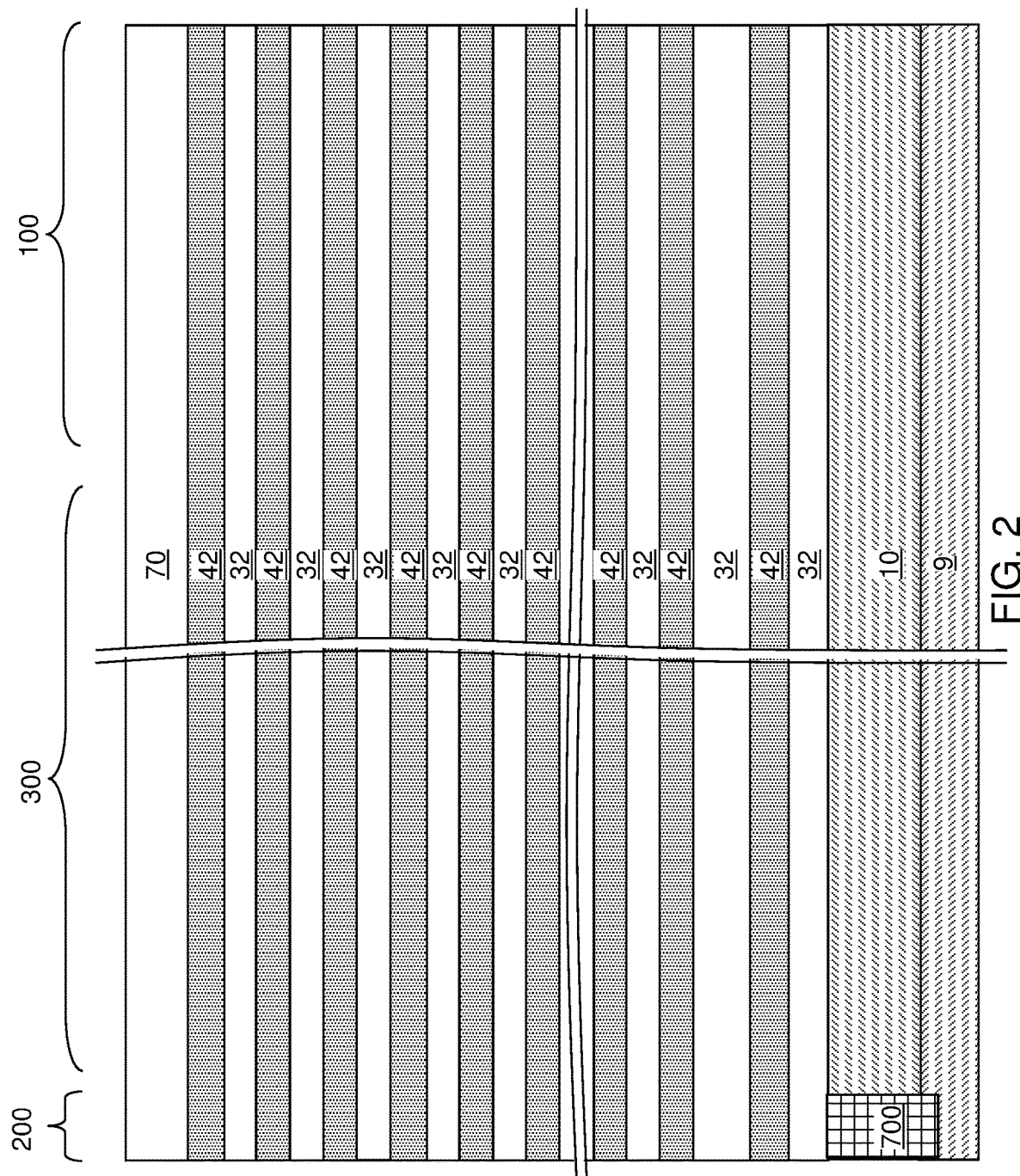
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
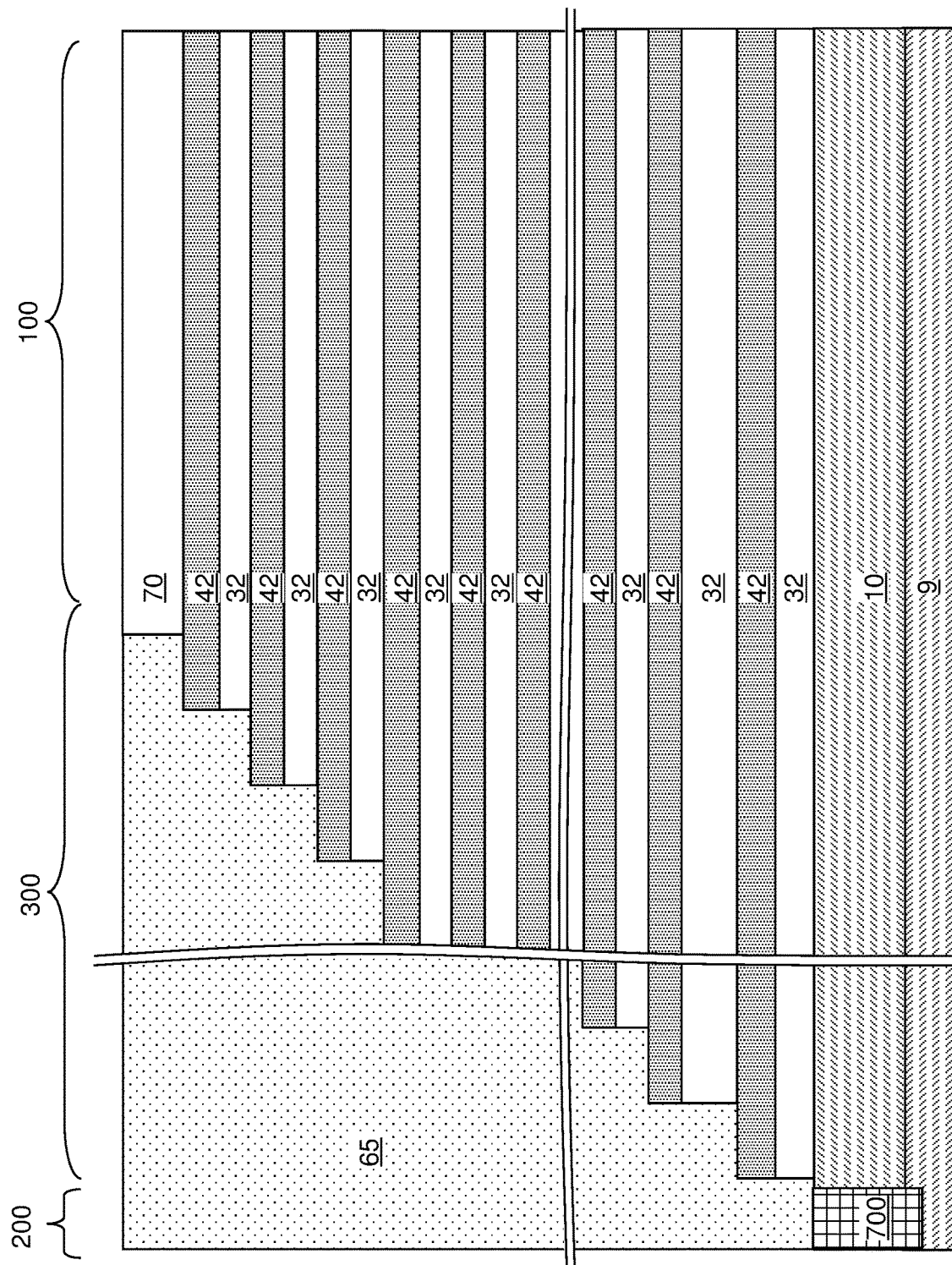
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
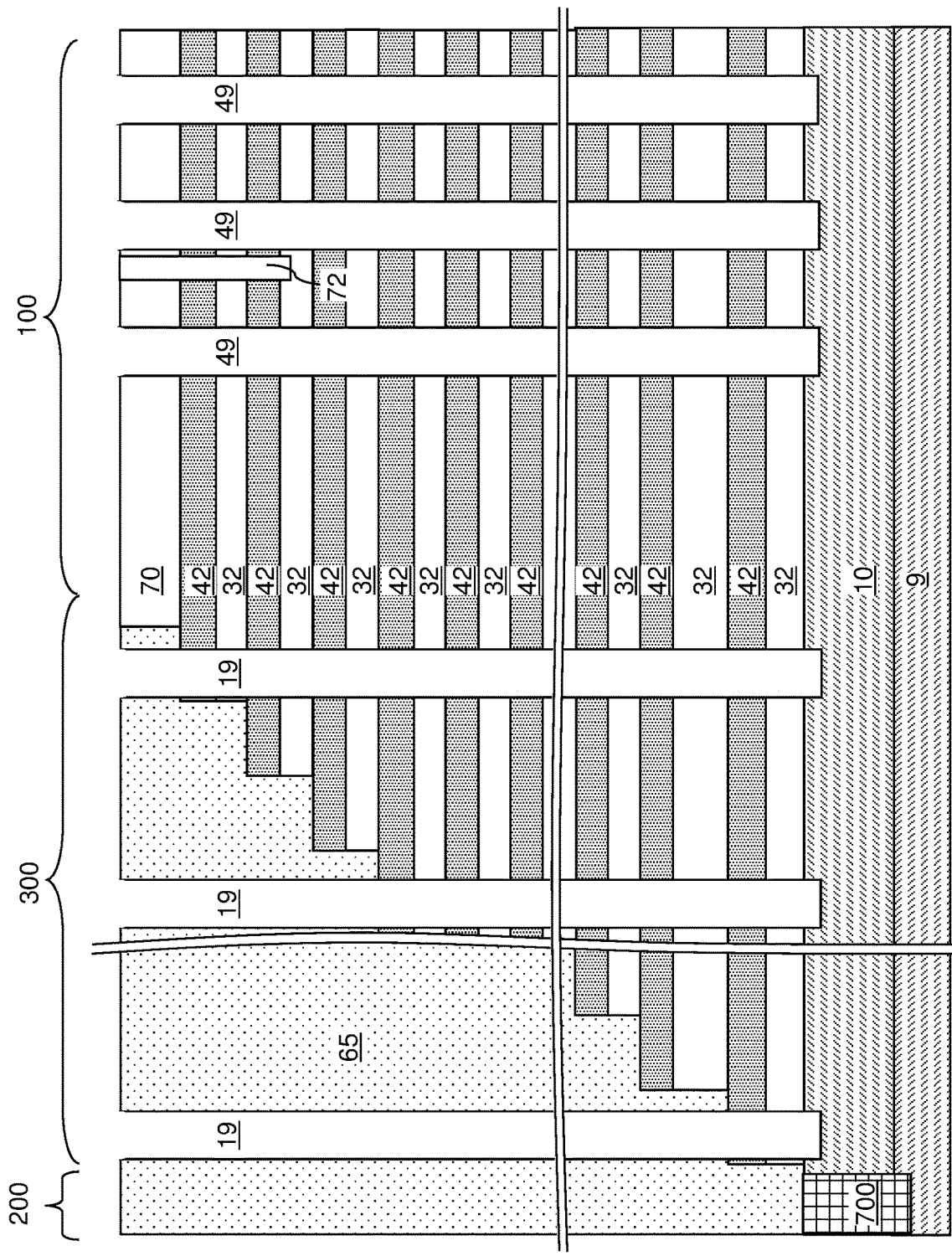
FIG. 4A is a schematic vertical cross-sectional view of the exemplary structure after formation of memory openings and support openings according to an embodiment of the present disclosure.
Figure 4B:
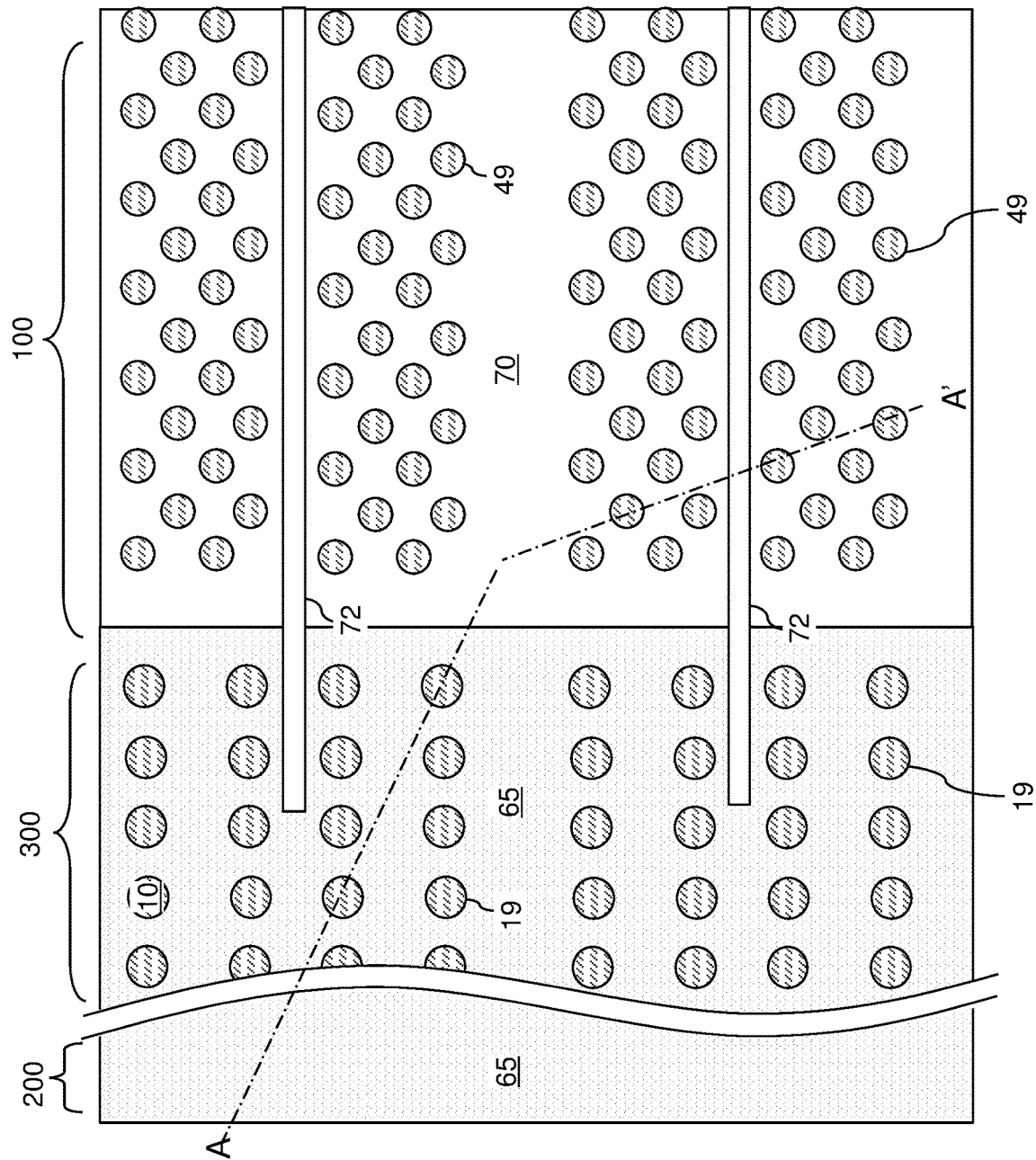
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5L illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a silicon oxide blocking dielectric layer 51, a dielectric metal oxide blocking dielectric layer 52, a charge storage layer 54, a tunneling dielectric layer 56, and a sacrificial cover layer 57 can be sequentially deposited in the memory openings 49.

The silicon oxide blocking dielectric layer 51 is deposited by a conformal deposition process. For example, the silicon oxide blocking dielectric layer 51 can be deposited by thermal decomposition of tetraethylorthosilicate (TEOS) in a chemical vapor deposition process. The thickness of the silicon oxide blocking dielectric layer 51 can be in a range from 2 nm to 10 nm, although lesser and greater thicknesses may also be employed.

The dielectric metal oxide blocking dielectric layer 52 includes a dielectric metal oxide material deposited by a conformal deposition process. The dielectric metal oxide blocking dielectric layer 52 can consist essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the dielectric metal oxide blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide blocking dielectric layer 52 can be in a range from 1 nm to 10 nm, such as from 2 nm to 4 nm, although lesser and greater thicknesses can also be employed.

In one embodiment, the dielectric metal oxide blocking dielectric layer 52 includes a dielectric metal oxide material that generates a dipole moment between a silicon oxide layer (such as the silicon oxide blocking dielectric layer 51) and a charge trapping material (such as silicon nitride) that is subsequently deposited thereupon. For example, the dielectric metal oxide blocking dielectric layer 52 can include aluminum oxide. The combination of the silicon oxide blocking dielectric layer 51 and the dielectric metal oxide blocking dielectric layer 52 can subsequently function as a blocking dielectric.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. In one embodiment, the sacrificial material layers 42 and the insulating layers 32 can have vertically coincident sidewalls, and the charge storage layer 54 can be formed as a single continuous layer. In one embodiment, the charge storage layer 54 can consist essentially of silicon nitride. The charge storage layer 54 can be deposited by a conformal deposition process such as a chemical vapor deposition process. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The sacrificial cover layer 57 includes a sacrificial material that protects the charge storage layer 56 during subsequent etch processes. For example, the sacrificial cover layer 57 may include a semiconductor material (such as amorphous silicon, polysilicon, or a silicon-germanium alloy), or amorphous carbon. The sacrificial cover layer 57 can be formed by a conformal deposition method such as low pressure chemical vapor deposition (LPCVD). The thickness of the sacrificial cover layer 57 can be in a range from 2 nm to 10 nm, although lesser and greater thicknesses can also be employed. A memory cavity 49' is formed in the volume of each memory opening 49 that is not filled with the deposited material layers (52, 54, 56, 57).

Referring to FIG. 5D, the sacrificial cover layer 57, the tunneling dielectric layer 56, the charge storage layer 54, the dielectric metal oxide blocking dielectric layer 52, and the silicon oxide blocking dielectric layer 51 are sequentially anisotropically etched employing at least one anisotropic etch process. The portions of the sacrificial cover layer 57, the tunneling dielectric layer 56, the charge storage layer 54, the dielectric metal oxide blocking dielectric layer 52, and the silicon oxide blocking dielectric layer 51 located above the top surface of the insulating cap layer 70 can be removed by the at least one anisotropic etch process. Further, the horizontal portions of the sacrificial cover layer 57, the tunneling dielectric layer 56, the charge storage layer 54, the dielectric metal oxide blocking dielectric layer 52, and the silicon oxide blocking dielectric layer 51 at a bottom of each memory cavity 49' can be removed to form openings in remaining portions thereof. Each of the sacrificial cover layer 57, the tunneling dielectric layer 56, the charge storage layer 54, and the dielectric metal oxide blocking dielectric layer 52 and the silicon oxide blocking dielectric layer 51 can be etched by a respective anisotropic etch process employing a respective etch chemistry, which may, or may not, be the same for the various material layers.

Each remaining portion of the silicon oxide blocking dielectric layer 51, the dielectric metal oxide blocking dielectric layer 52, the charge storage layer 54, and the tunneling dielectric layer 56 comprises an annular horizontal portion AH and a cylindrical vertical portion CV adjoined to the annular horizontal portion. The outer part of the top end of annular horizontal portion AH is adjoined to a bottom end of the cylindrical vertical portion CV. The annular horizontal portion has an annular top surface and an annular bottom surface. Each remaining portion of the sacrificial cover layer 57 can have a tubular configuration. Sidewalls of the silicon oxide blocking dielectric layer 51, the dielectric metal oxide blocking dielectric layer 52, and the charge storage layer 54, the tunneling dielectric layer 56 in the annular horizontal portion AH are physically exposed upon completion of the at least one anisotropic etch process.

A surface of the pedestal channel portion 11 (or a surface of the semiconductor material layer 10 in case the pedestal channel portions 11 are not employed) can be physically exposed underneath the opening through the sacrificial cover layer 57, the tunneling dielectric layer 56, the charge storage layer 54, and the dielectric metal oxide blocking dielectric layer 52 and the silicon oxide blocking dielectric layer 51. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A contiguous set of a silicon oxide blocking dielectric layer 51, a dielectric metal oxide blocking dielectric layer 52, a charge storage layer 54, and a tunneling dielectric layer 56 in a memory opening 49 constitutes a memory film 50, which includes a plurality of charge storage regions comprising portions of the charge storage layer 54) that are insulated from surrounding materials by the dielectric metal oxide blocking dielectric layer 52, the silicon oxide blocking dielectric layer 51, and the tunneling dielectric layer 56. In one embodiment, the sacrificial cover layer 57, the tunneling dielectric layer 56, the charge storage layer 54, the dielectric metal oxide blocking dielectric layer 52, and the silicon oxide blocking dielectric layer 51 can have vertically coincident sidewalls.

Referring to FIG. 5E, a first isotropic etch process can be performed to isotropically recess physically exposed surfaces of the charge storage layer 54 selective to the silicon oxide blocking dielectric layer 51 and the sacrificial cover layer 57. The first isotropic etch process may be selective to the materials of the tunneling dielectric layer 56, and may, or may not, be selective to the material of the dielectric metal oxide blocking dielectric layer 52. For example, the first isotropic etch process may employ hot phosphoric acid or a mixture of hydrofluoric acid and ethylene glycol that provides a controlled isotropic etch of silicon nitride selective to silicon oxide and aluminum oxide. The first isotropic etch process can remove the annular horizontal portion of each charge storage layer 54, and an inner sidewall of the cylindrical vertical portion of the dielectric metal oxide blocking dielectric layer 52 can be physically exposed to a first annular recess cavity that is formed in volumes from which the annular horizontal portion of the charge storage layer 54 is removed.

Referring to FIG. 5F, a second isotropic etch process can be performed to isotropically recess physically exposed surfaces of the silicon oxide blocking dielectric layer 51 selective to the charge storage layer 54 and the sacrificial cover layer 57. The second isotropic etch process may collaterally etch the materials of the tunneling dielectric layer 56, and may, or may not, be selective to the material of the dielectric metal oxide blocking dielectric layer 52. For example, the second isotropic etch process may employ dilute hydrofluoric acid that provides a controlled isotropic etch of silicon oxide selective to silicon nitride. The second isotropic etch process can remove the annular horizontal portion of each silicon oxide blocking dielectric layer 51. Further, the second isotropic etch process can collaterally remove the annular horizontal portion of each tunneling dielectric layer 56 and can recess end portions of the cylindrical vertical portion of each tunneling dielectric layer 56. In one embodiment, a bottom portion of an inner sidewall of the cylindrical vertical portion of the charge storage layer 54 can be physically exposed to the first annular recess cavity that is expanded due to removal of the annular horizontal portion of each tunneling dielectric layer 56. A second annular recess cavity can be formed between the annular horizontal portion of the dielectric metal oxide blocking dielectric layer 52 and the pedestal channel portion 11. FIG. 5F shows an inset in which a bottom-up view is shown, which is a view along an upward vertical direction from plane X-X'. The inset illustrates a physically exposed annular bottom surface of the dielectric metal oxide blocking dielectric layer 52, a physically exposed annular bottom surface of the charge storage layer 54, and a physically exposed annular bottom surface of the tunneling dielectric layer 56.

Referring to FIG. 5G, a third isotropic etch process can be performed to isotropically etch physically exposed surfaces of dielectric metal oxide blocking dielectric layer 52 selective to the silicon oxide blocking dielectric layer 51. For example, if the dielectric metal oxide blocking dielectric layer 52 comprises aluminum oxide, then the third isotropic etch process may include a wet etch process employing a combination of phosphoric acid, nitric acid, and acetic acid to etch aluminum oxide. The third isotropic etch process can remove the annular horizontal portion of each dielectric metal oxide blocking dielectric layer 52. In one embodiment, a bottom portion of an outer sidewall of the cylindrical vertical portion of the charge storage layer 54 can be physically exposed. The first annular recess cavity and the second annular recess cavity merge with each other to form an annular recess cavity within each memory opening 49. In one embodiment, a concave tapered annular bottom surface of the dielectric metal oxide blocking dielectric layer 52 can be physically exposed after the third isotropic etch process.

In some embodiments, the first, second and third isotropic etch processes may be performed in any order, and/or any two or all three of these isotropic etch process may be merged into a single isotropic etch process. For example, the processing steps of FIGS. 5E and 5F may be reversed, or the processing steps of FIGS. 5E and 5F may be merged by performing a single isotropic etch process that recesses the materials of the charge storages layer 54 and the silicon oxide blocking dielectric layer 51 concurrently. Alternatively or additionally, the processing steps of FIG. 5G may be merged with the processing steps of FIG. 5E and/or with the processing steps of FIG. 5F.

Generally, each of the silicon oxide blocking dielectric layer 51, the dielectric metal oxide blocking dielectric layer 52, and the charge storage layer 54 comprises a respective annular horizontal portion adjoined to a bottom end of a respective cylindrical vertical portion. In one embodiment, the annular horizontal portions of the silicon oxide blocking dielectric layer 51 and the charge storage layer 54 can be removed prior to removing the annular horizontal portion of the dielectric metal oxide blocking dielectric layer 52 so that the collateral etching of the silicon oxide blocking dielectric layer 51 can be limited. The silicon oxide blocking dielectric layer 51 can continuously extend to an outer edge of a topmost surface of the pedestal channel portion 11 so that insulating layers 32 are not physically exposed to the memory cavities 49'.

Referring to FIG. 5H, a selective etch process that etches the material of the sacrificial cover layer 57 can be performed. For example, if the sacrificial cover layer 57 comprises amorphous silicon or polysilicon, then a wet etch process using trimethyl-2 hydroxyethyl ammonium hydroxide ("TMY") or tetramethyl ammonium hydroxide (TMAH) may be used to remove the sacrificial cover layer 57. In an alternative embodiment, if the sacrificial cover layer 57 comprises amorphous silicon or polysilicon, then it may be retained in the final device.

Referring to FIG. 5I, a semiconductor channel material layer 60L can be deposited directly on the physically exposed surfaces within the memory openings 49 and over the insulating cap layer 70. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 30 nm, although lesser and greater thicknesses can also be employed. The semiconductor channel material layer 60L may partially fill the memory cavity 49' in each memory opening, or may fully fill the cavity in each memory opening.

Referring to FIG. 5J, in case the memory cavity 49' in each memory opening is not completely filled by the semiconductor channel material layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5K, the dielectric core layer 62L can be vertically recessed such that each remaining portion of the dielectric core layer 62L has a top surface located underneath the horizontal plane including the top surface of the insulating cap layer 70. A recess etch process that etches the dielectric material of the dielectric core layer 52L selective to the material of the semiconductor channel material layer 60L can be performed. Each remaining portion of the dielectric core layer 62L constitutes a dielectric core 62.

Referring to FIG. 5L, a doped semiconductor material can be deposited over the dielectric cores 62 by a conformal deposition process. The doped semiconductor material can have a doping of a second conductivity type that is the opposite of the first conductivity type. For example, if the first conductivity type is p-type, the second conductivity type is n-type, and vice versa. The dopant concentration in the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

A chemical mechanical planarization process can be performed to remove portions of the doped semiconductor material having a doping of the second conductivity type and the semiconductor channel material layer 60L from above a horizontal plane including top surfaces of the silicon oxide blocking dielectric layer 51, the dielectric metal oxide blocking dielectric layer 52, the charge storage layer 54, and the tunneling dielectric layer 56. Each remaining portion of the semiconductor channel material layer 60L in a memory opening 49 constitutes a vertical semiconductor channel 60 through which electrical current can flow when a vertical NAND device including the vertical semiconductor channel 60 is turned on. Each remaining portion of the doped semiconductor material having a doping of the second conductivity type constitutes a drain region 63.

A tunneling dielectric layer 56 is surrounded by a charge storage layer 54, and laterally surrounds a portion of the vertical semiconductor channel 60. Each adjoining set of a silicon oxide blocking dielectric layer 51, a dielectric metal oxide blocking dielectric layer 52, a charge storage layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer, a plurality of memory elements comprising portions of the charge storage layer 54, a dielectric metal oxide blocking dielectric layer 52, and a silicon oxide blocking dielectric layer 51. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5M:
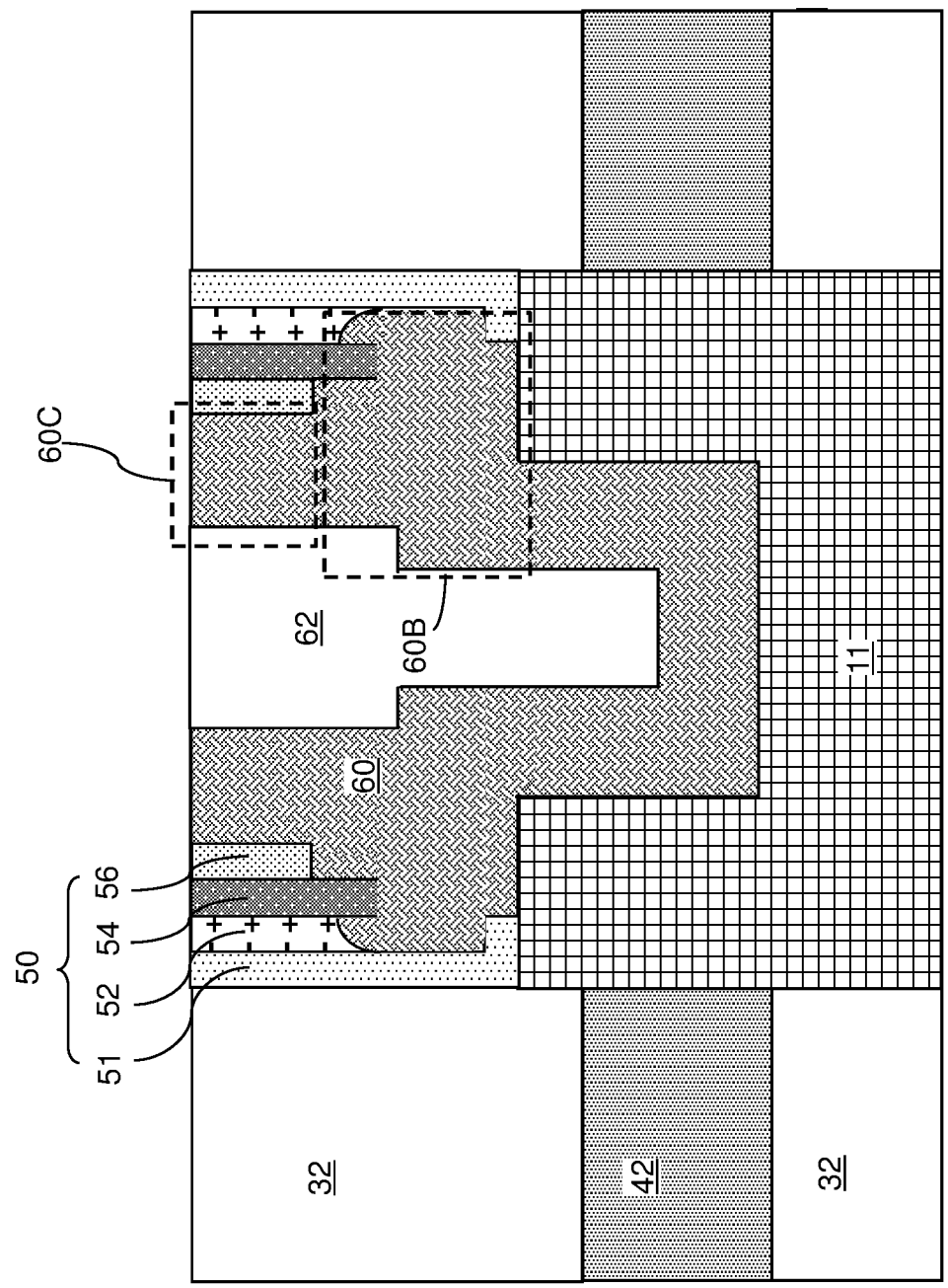
FIG. 5M is a magnified view of a portion of a memory opening fill structure that shows absence of a portion of the dielectric metal oxide blocking dielectric layer that could generate reverse dipole effects

Referring to FIG. 5M, a bottom portion of a memory film 50 is illustrated. The dielectric metal oxide blocking dielectric layer 52 can have a dipole moment caused by electric field across the charge storage layer 54 and the silicon oxide blocking dielectric layer 51 during operation. The positive electrical charges due to the dipole moment within the dielectric metal oxide blocking dielectric layer 52 are schematically represented by the "+" symbols, and the negative electrical charges due to the dipole moment within the dielectric metal oxide blocking dielectric layer 52 are schematically represented by the "−" symbols." The positive electrical charges facing the p-type vertical semiconductor channel 60 enhance the electric field and the on-current through the channel 60. However, extension of the dielectric metal oxide blocking dielectric layer 52 over the top surface of the pedestal channel portion would provide a geometry in which a reverse dipole direction would be generated which would reduce the electric field and the on-current through a p-type vertical semiconductor channel 60 due to the presence of negative charge in the annular horizontal portion of the dielectric metal oxide blocking dielectric layer 52 near the channel 60. In other words, the reverse direction of the dipole disturbs the on state of fringe parts of the channel 60. According to an aspect of the present disclosure, removal of the layers of the annular horizontal portion AH which include the annular horizontal portion of the dielectric metal oxide blocking dielectric layer 52 from above the top surface of the pedestal channel portion 11 reduces or eliminates the reverse dipole direction, and thus increases the electric field and the on-current of the vertical semiconductor channel 60.

As shown in FIG. 5M, the vertical semiconductor channel 60 comprises a cylindrical portion 60C which contacts an inner sidewall of the tunneling dielectric layer 56, and a bulging portion 60B located between the cylindrical portion 60C and the pedestal channel portion 11. The bulging portion 60B is thicker than the vertical portion 60 (i.e., has a greater extent in the horizontal direction). A top surface of the bulging portion 60B contacts an annular bottom surface of the tunneling dielectric layer 56 (illustrated in the inset in FIG. 5H), an annular bottom surface of the charge storage layer 54 (illustrated in the inset in FIG. 5H), an annular bottom surface of the dielectric metal oxide blocking dielectric layer 52 (illustrated in the inset in FIG. 5H). An outer sidewall of the bulging portion 60B contacts a bottom portion of a cylindrical inner sidewall of the silicon oxide blocking dielectric layer 51. In one embodiment, the charge storage layer 54 protrudes down into the bulging portion 60B such that the top surface of the bulging portion 60B is non-planar.

Figure 6:
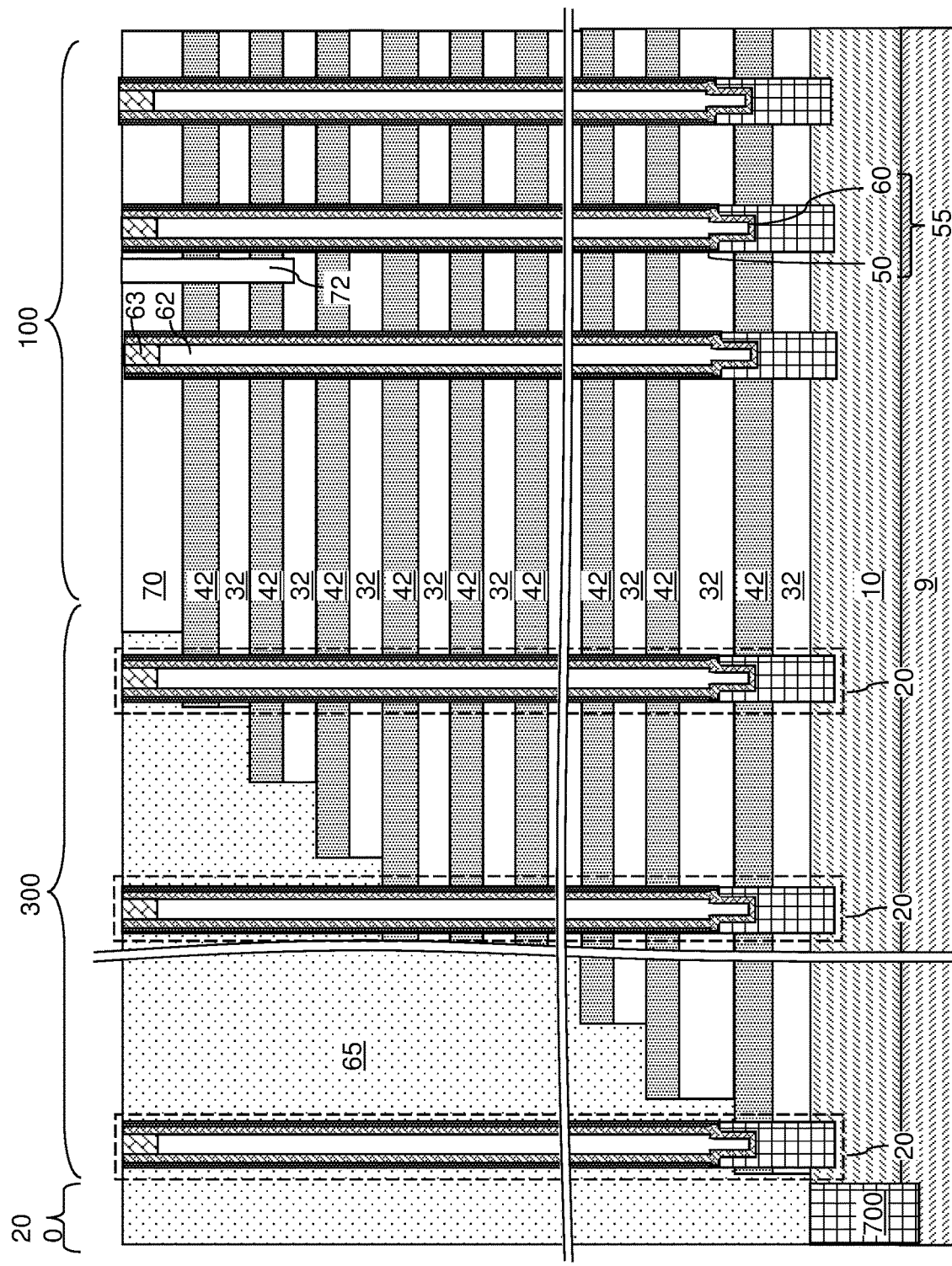
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a charge storage layer 54 laterally surrounding the tunneling dielectric layer 56. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
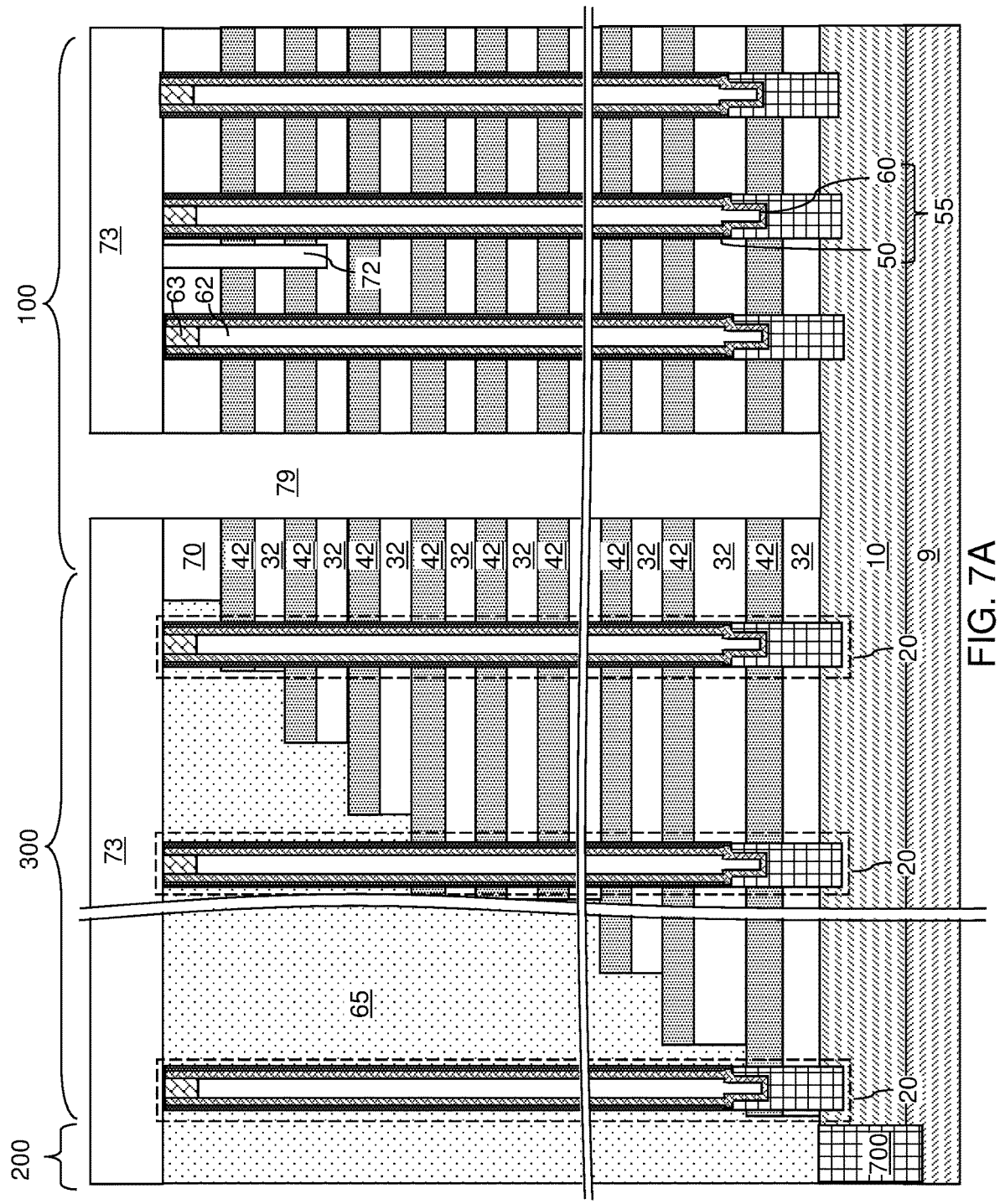
FIG. 7A is a schematic vertical cross-sectional view of the exemplary structure after formation of backside trenches according to an embodiment of the present disclosure.
Figure 7B:
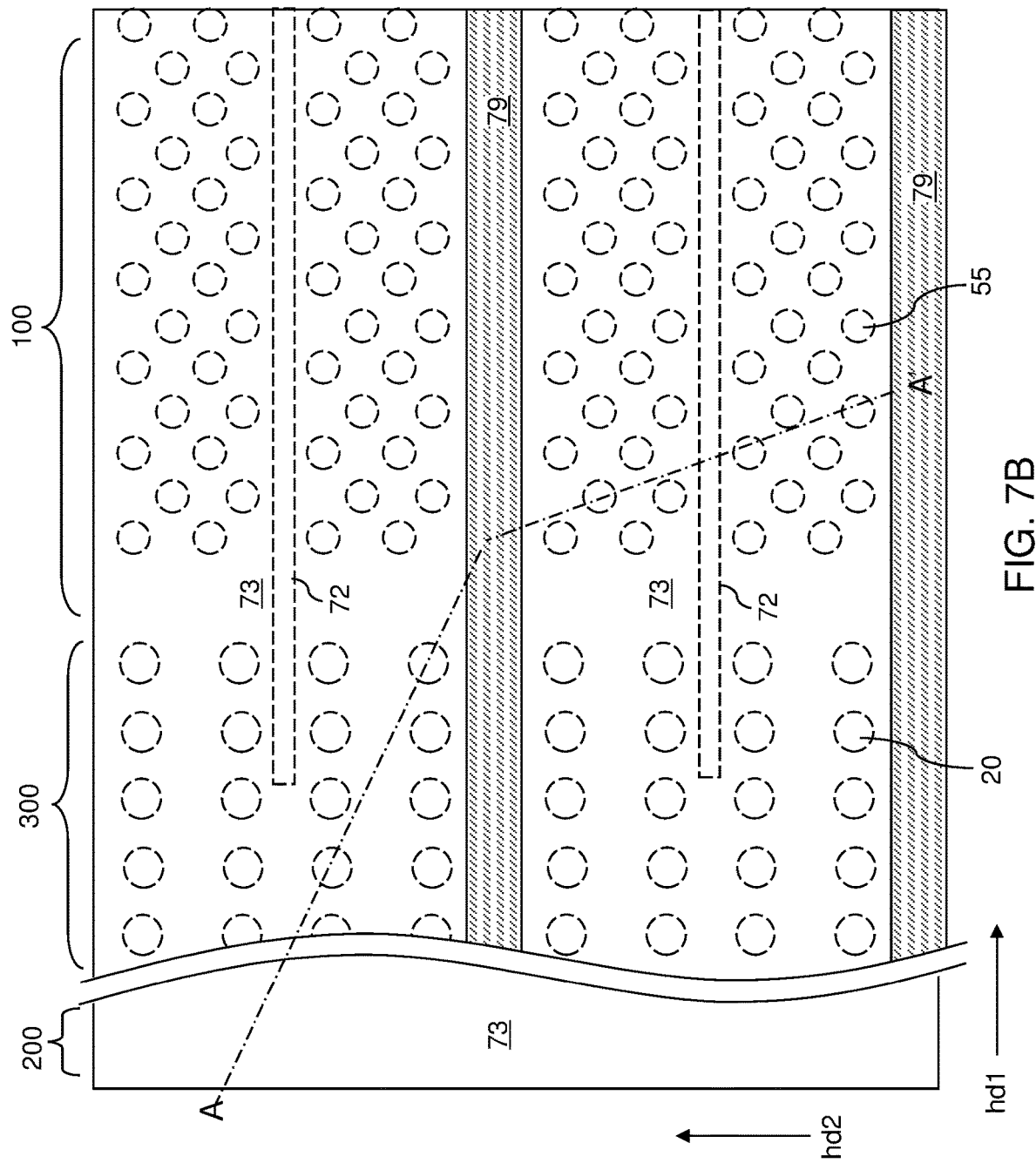
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
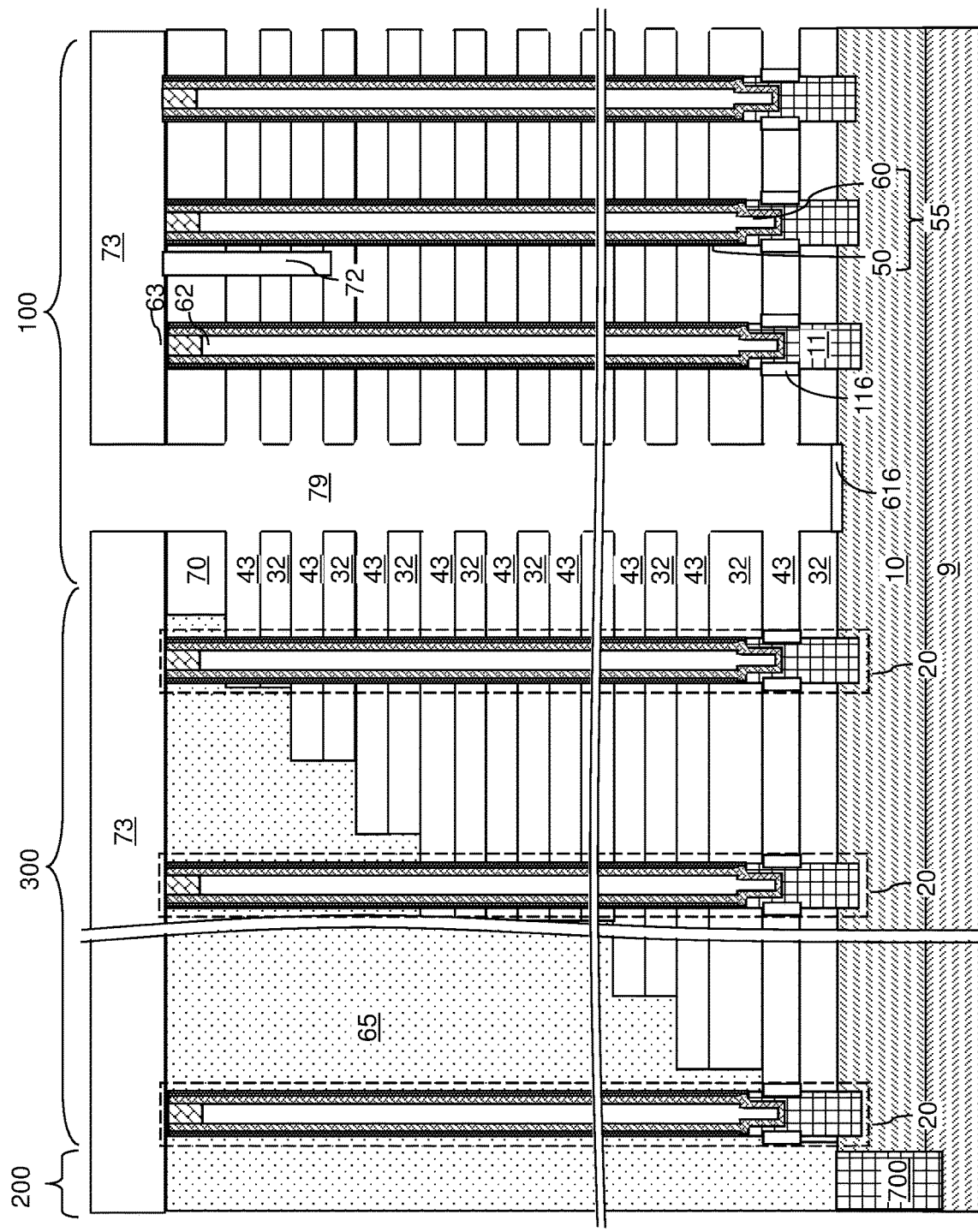
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
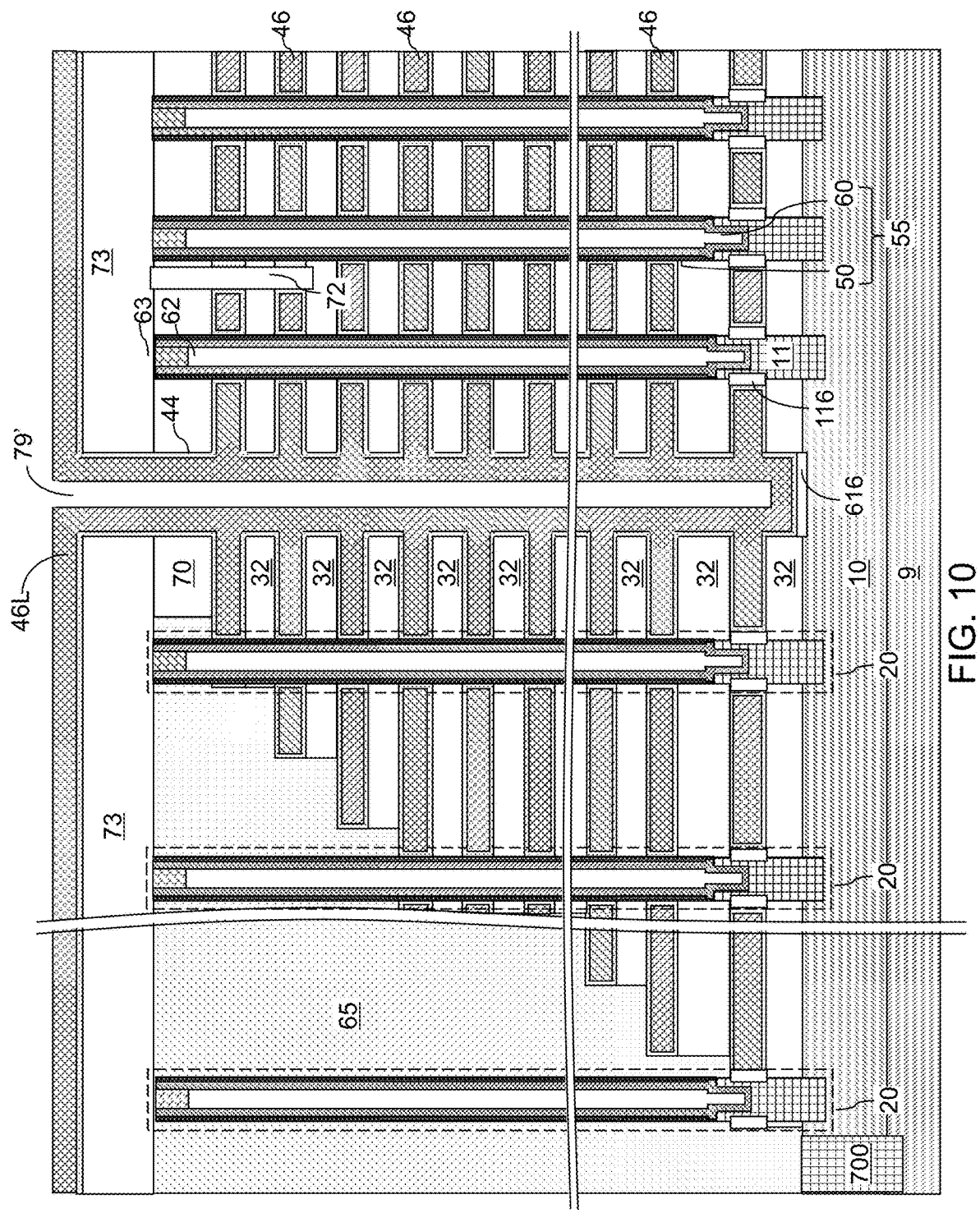
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
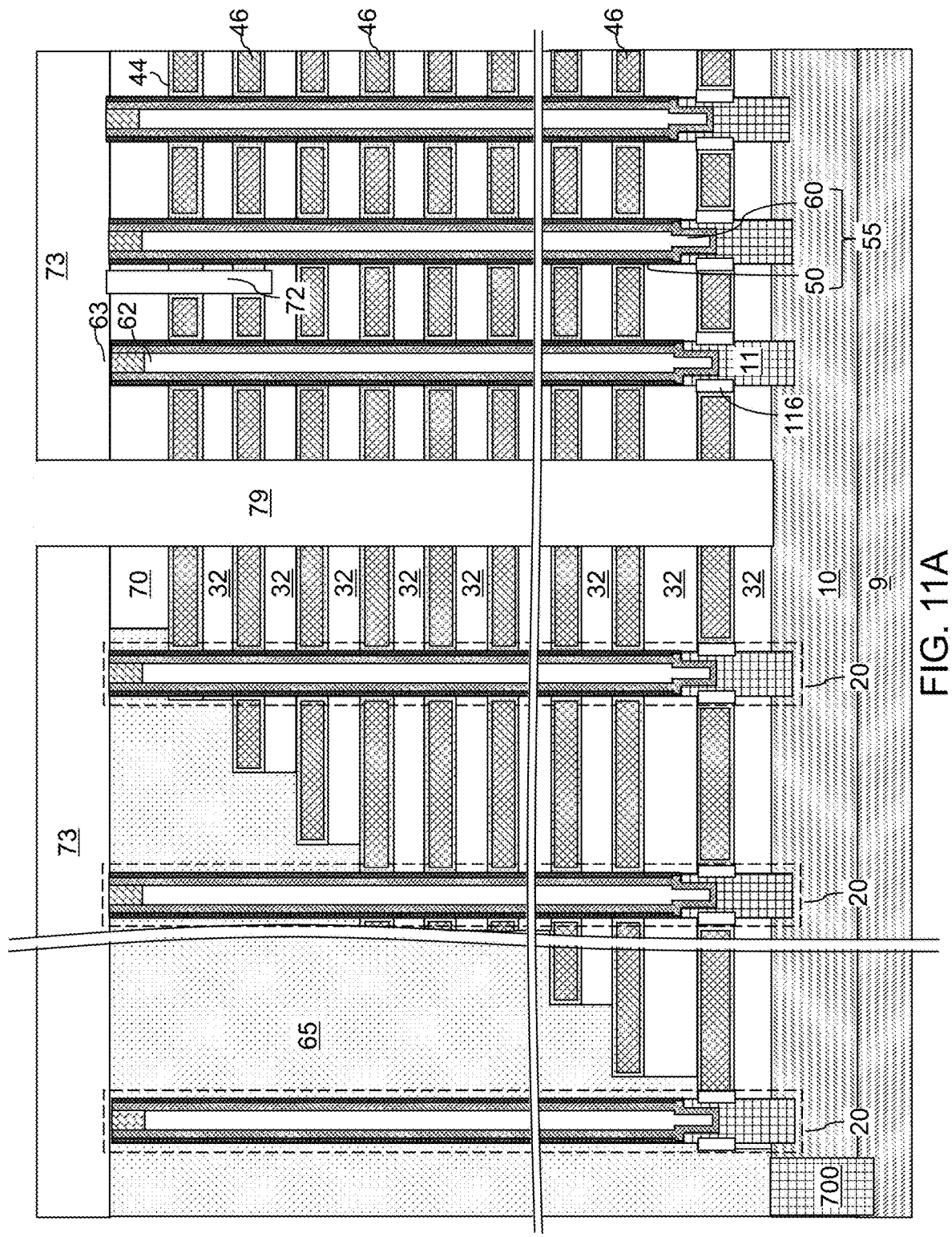
FIG. 11A is a schematic vertical cross-sectional view of the exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
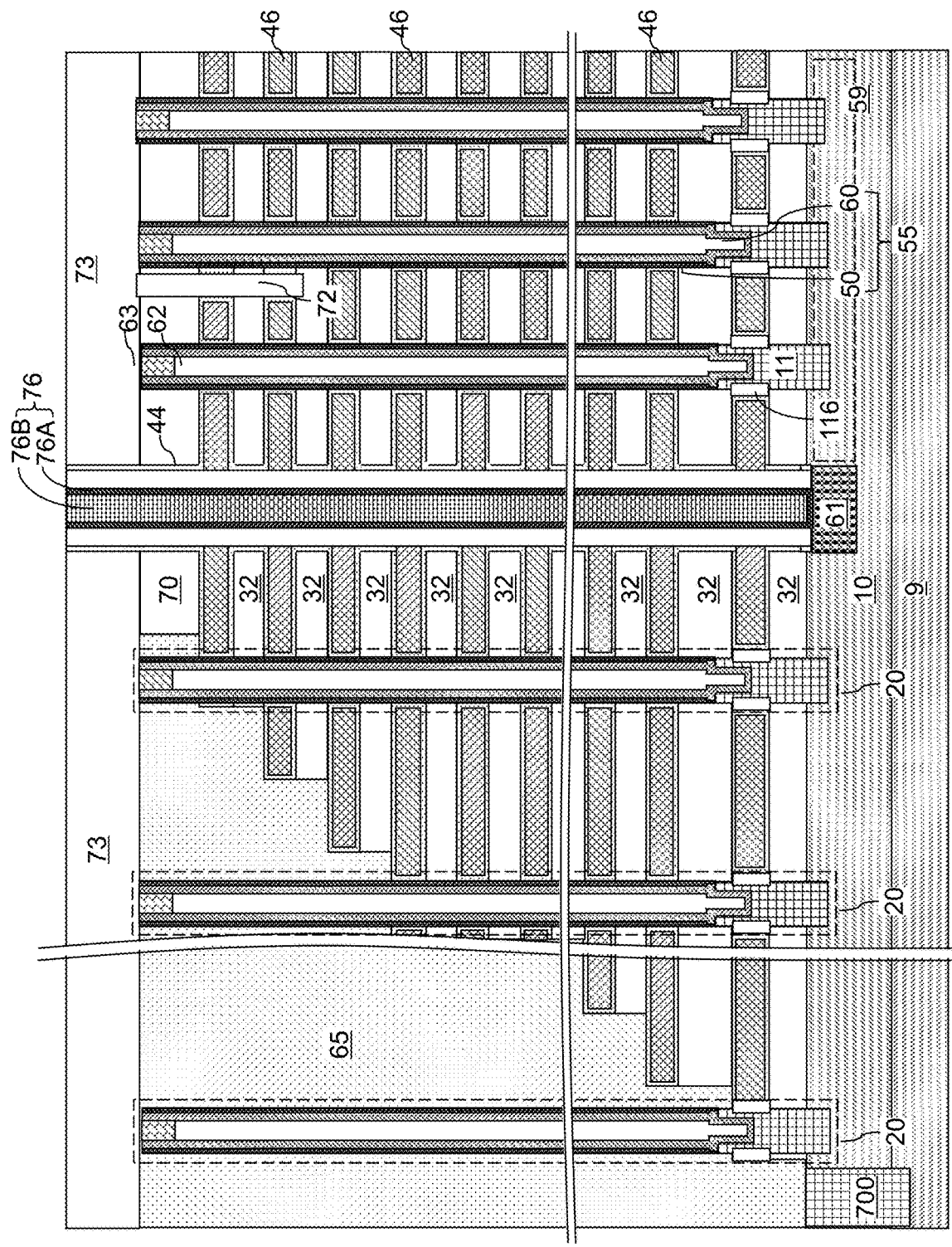
FIG. 12A is a schematic vertical cross-sectional view of the exemplary structure after formation of an insulating spacer and a backside contact structure according to an embodiment of the present disclosure.
Figure 12B:
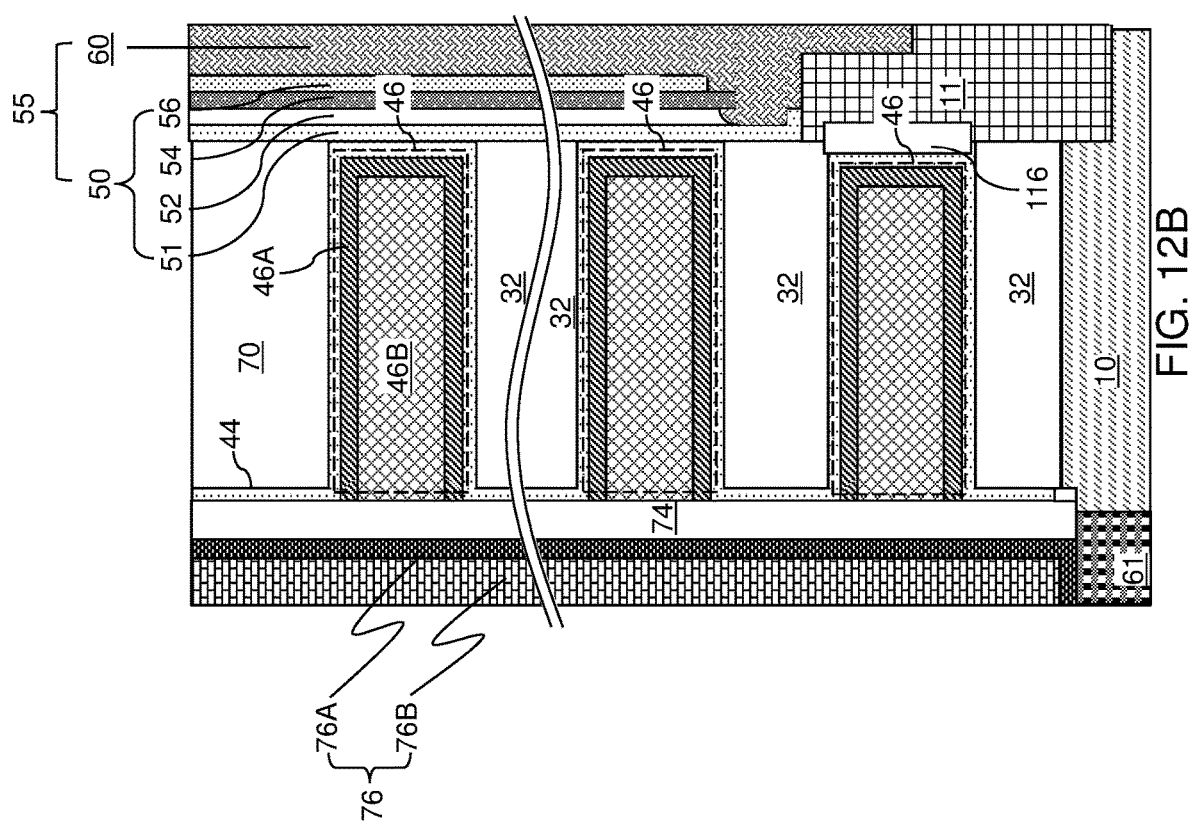
FIG. 12B is a magnified view of a region of the exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 13A:
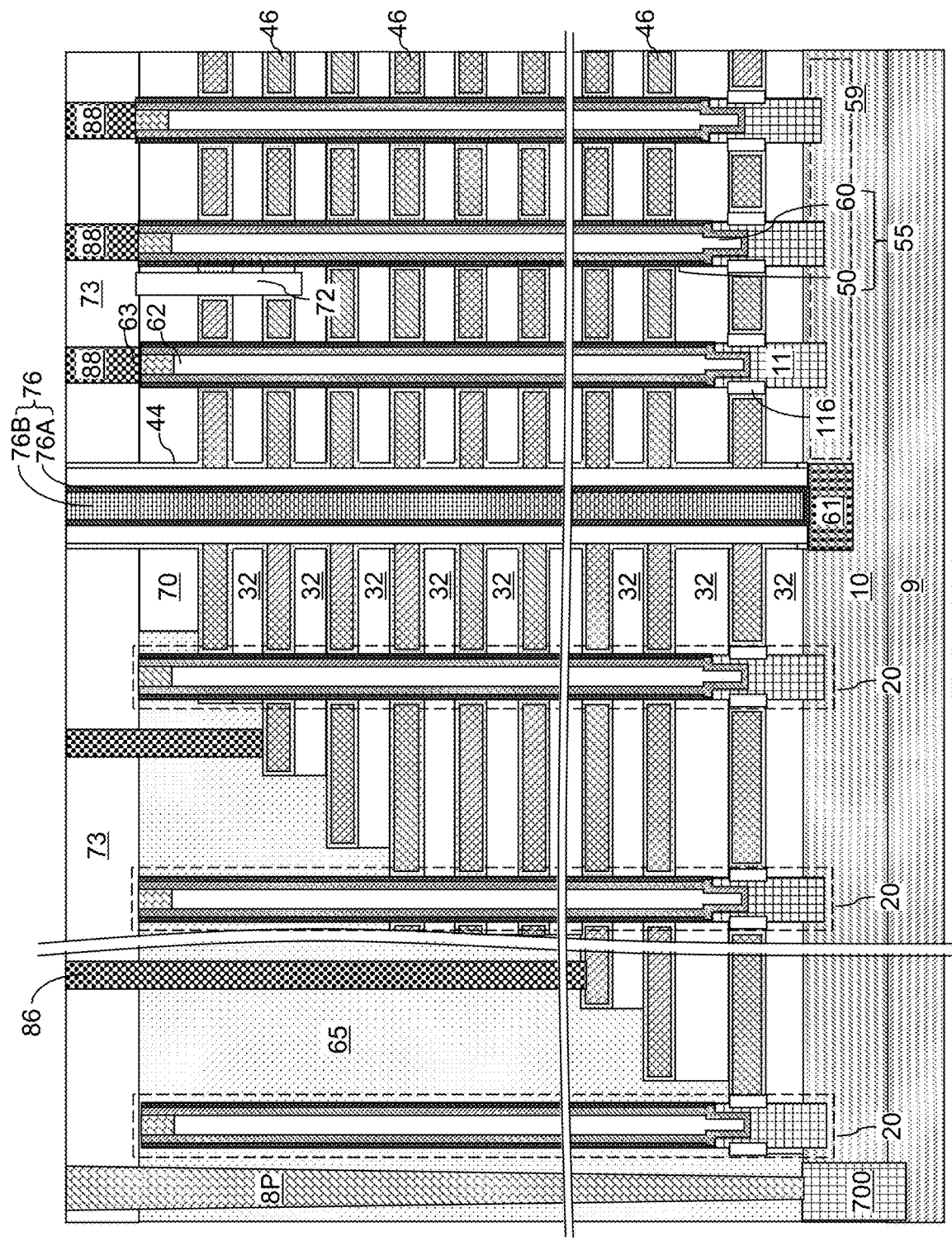
FIG. 13A is a schematic vertical cross-sectional view of the exemplary structure after formation of additional contact via structures according to an embodiment of the present disclosure.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a memory device is provided, which comprises: an alternating stack of insulating layers 32 and electrically conductive layers 46 located over a substrate (9, 10); a memory opening 49 vertically extending through the alternating stack (32, 46); and a memory opening fill structure 58 located in the memory opening 49, wherein: the memory opening fill structure 58 comprises a memory film 50 and a vertical semiconductor channel 60; and the memory film 50 comprises a tunneling dielectric layer 56, a charge storage layer 54 that laterally surrounds the tunneling dielectric layer 56, a dielectric metal oxide blocking dielectric layer 52 that laterally surrounds the charge storage layer 54 and contacts the vertical semiconductor channel 60, and a silicon oxide blocking dielectric layer 51 that laterally surrounds the dielectric metal oxide blocking dielectric layer 52 and contacts the vertical semiconductor channel 60.

In one embodiment, an annular bottom surface of the charge storage layer 54 contacts the vertical semiconductor channel 60. In one embodiment shown in FIG. 5M, the bottom portions of inner and outer sidewalls of the charge storage layer contact the bulging portion 60C of the vertical semiconductor channel 60.

In one embodiment, the charge storage layer 54 vertically extends downward from a bottom periphery of an outer sidewall of the tunneling dielectric layer 56. In one embodiment, the charge storage layer 54 vertically extends downward from a bottom periphery of an inner sidewall of the dielectric metal oxide blocking dielectric layer 52.

In one embodiment, a bottom portion of a cylindrical inner sidewall of the silicon oxide blocking dielectric layer 51 contacts the vertical semiconductor channel 60. In one embodiment, a concave tapered annular bottom surface of the dielectric metal oxide blocking dielectric layer 52 contacts the vertical semiconductor channel 60.

In one embodiment, the vertical semiconductor channel 60 contacts an annular bottom surface of the tunneling dielectric layer 56, an annular bottom surface of the charge storage layer 54, an annular bottom surface of the dielectric metal oxide blocking dielectric layer 52, and a bottom portion of a cylindrical inner sidewall of the silicon oxide blocking dielectric layer 51.

In one embodiment, the memory opening fill structure 58 comprises a pedestal channel portion 11 contacting a bottom end of the vertical semiconductor channel 60 and an annular bottom surface of the silicon oxide blocking dielectric layer 51, wherein the dielectric metal oxide blocking dielectric layer 52 is vertically spaced from the pedestal channel portion 11. In one embodiment, the pedestal channel portion 11 comprises a single crystalline semiconductor material; a bottom periphery of an interface between the silicon oxide blocking dielectric layer 51 and the vertical semiconductor channel 60 is adjoined to a topmost surface of the pedestal channel portion 11; and the vertical semiconductor channel 60 vertically extends below a horizontal plane including the topmost surface of the pedestal channel portion 11.

In one embodiment, the charge storage layer 54 comprises a silicon nitride layer; and the dielectric metal oxide blocking dielectric layer 52 comprises an aluminum oxide layer.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers located over a substrate;
a memory opening vertically extending through the alternating stack; and
a memory opening fill structure located in the memory opening,
wherein:
the memory opening fill structure comprises a memory film and a vertical semiconductor channel that comprises a cylindrical portion that vertically extends through at least a topmost one of the electrically conductive layers and a bulging portion that is adjoined to a bottom end of the cylindrical portion and having a greater lateral extent than the cylindrical portion;
the memory film comprises a tunneling dielectric layer, a charge storage layer that laterally surrounds the tunneling dielectric layer, a dielectric metal oxide blocking dielectric layer that laterally surrounds the charge storage layer and contacts the bulging portion of the vertical semiconductor channel, and a silicon oxide blocking dielectric layer that laterally surrounds the dielectric metal oxide blocking dielectric layer;
the tunneling dielectric layer has an inner cylindrical sidewall that directly contacts the cylindrical portion of the vertical semiconductor channel within a first cylindrical vertical plane;
an outer annular region of the bulging portion of the vertical semiconductor channel is located entirely outside the first cylindrical vertical plane, wherein the outer annular region of the bulging portion of the vertical semiconductor channel is in direct contact with an entirety of a bottom surface of the charge storage layer, and wherein a bottom portion of an inner cylindrical sidewall of the silicon oxide blocking dielectric layer is in direct contact with the outer annular region of the bulging portion of the vertical semiconductor channel; and
the charge storage layer has an inner cylindrical sidewall that directly contacts a first cylindrical surface segment of the outer annular region of the bulging portion of the vertical semiconductor channel within a second cylindrical vertical plane that is laterally offset outward relative to the first cylindrical vertical plane by a thickness of the tunneling dielectric layer.

2. The memory device of claim 1, wherein an annular bottom surface of the charge storage layer contacts an annular surface of the bulging portion of the vertical semiconductor channel.

3. The memory device of claim 1, wherein a bottom portion of an outer cylindrical sidewall of the charge storage layer contacts a second cylindrical surface segment of the bulging portion of the vertical semiconductor channel within a third cylindrical vertical plane that is laterally offset outward relative to the second cylindrical vertical plane by a thickness of the charge storage layer.

4. The memory device of claim 3, wherein the charge storage layer vertically extends downward from a bottom periphery of an outer cylindrical sidewall of the tunneling dielectric layer and is located entirely outside the second cylindrical vertical plane.

5. The memory device of claim 3, wherein the charge storage layer vertically extends downward from a bottom periphery of an inner cylindrical sidewall of the dielectric metal oxide blocking dielectric layer.

6. The memory device of claim 3, wherein a bottom portion of an inner cylindrical sidewall of the silicon oxide blocking dielectric layer contacts a third cylindrical surface segment of the bulging portion of the vertical semiconductor channel within a fourth cylindrical vertical plane that is laterally offset outward relative to the third cylindrical vertical plane by a thickness of the dielectric metal oxide blocking dielectric layer.

7. The memory device of claim 6, wherein the dielectric metal oxide blocking dielectric layer comprises a concave annular bottom surface that contacts a convex annular surface segment of the bulging portion of the vertical semiconductor channel between the third cylindrical vertical plane and the fourth cylindrical vertical plane.

8. The memory device of claim 1, wherein a bottom portion of a cylindrical inner sidewall of the silicon oxide blocking dielectric layer contacts the vertical semiconductor channel.

9. The memory device of claim 1, wherein a concave tapered annular bottom surface of the dielectric metal oxide blocking dielectric layer contacts the vertical semiconductor channel.

10. The memory device of claim 1, wherein the vertical semiconductor channel contacts an annular bottom surface of the tunneling dielectric layer, an annular bottom surface of the charge storage layer, an annular bottom surface of the dielectric metal oxide blocking dielectric layer, and a bottom portion of a cylindrical inner sidewall of the silicon oxide blocking dielectric layer.

11. The memory device of claim 1, wherein the memory opening fill structure further comprises a pedestal channel portion contacting a bottom end of the vertical semiconductor channel and an annular bottom surface of the silicon oxide blocking dielectric layer, wherein the dielectric metal oxide blocking dielectric layer is vertically spaced from the pedestal channel portion and does not directly contact the pedestal channel portion.

12. The memory device of claim 11, wherein:
the pedestal channel portion comprises a single crystalline semiconductor material;
a bottom periphery of an interface between the silicon oxide blocking dielectric layer and the vertical semiconductor channel is adjoined to a topmost surface of the pedestal channel portion; and
the vertical semiconductor channel vertically extends below a horizontal plane including the topmost surface of the pedestal channel portion.

13. The memory device of claim 11, wherein:
the cylindrical portion-contacts an inner sidewall of the tunneling dielectric layer, and the bulging portion is located between the cylindrical portion and the pedestal channel portion;
the bulging portion is thicker than the vertical portion;
a top surface of the bulging portion contacts an annular bottom surface of the tunneling dielectric layer, an annular bottom surface of the charge storage layer, and an annular bottom surface of the dielectric metal oxide blocking dielectric layer; and
an outer sidewall of the bulging portion contacts a bottom portion of a cylindrical inner sidewall of the silicon oxide blocking dielectric layer.

14. The memory device of claim 1, wherein the memory opening fill structure comprises a pedestal channel portion that contacts a bottom end of the vertical semiconductor channel.

15. The memory device of claim 14, wherein the pedestal channel portion does not directly contact the charge storage layer.

16. The memory device of claim 14, wherein the pedestal channel portion is not in direct contact with the dielectric metal oxide blocking dielectric layer.

17. The memory device of claim 14, wherein the pedestal channel portion is not in direct contact with the tunneling dielectric layer.

18. The memory device of claim 1, wherein the inner sidewall of the silicon oxide blocking dielectric layer comprises a vertical inner sidewall, and the bottom portion of the inner sidewall comprises a vertical bottom portion of the inner sidewall which contacts the vertical semiconductor channel.

19. The memory device of claim 1, wherein:
the silicon oxide blocking dielectric layer comprises and annular horizontal portion adjoined to a bottom end of a cylindrical vertical portion; and
a lateral distance between an outer periphery of a bottom surface of the annular horizontal portion and an inner periphery of the bottom surface of the annular horizontal portion is greater than a lateral thickness of the cylindrical vertical portion as measured between an outer sidewall of the cylindrical vertical portion and an inner sidewall of the cylindrical vertical portion.

* * * * *